(12) United States Patent
Konno et al.

(10) Patent No.: US 9,196,627 B2
(45) Date of Patent: Nov. 24, 2015

(54) NONVOLATILE SEMICONDUCTOR MEMORY DEVICE AND METHOD OF FABRICATING THE SAME

(71) Applicant: Kabushiki Kaisha Toshiba, Minato-ku (JP)

(72) Inventors: Atsushi Konno, Mie-ken (JP); Ryota Katsumata, Mie-ken (JP); Yoshiaki Fukuzumi, Mie-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/197,427

(22) Filed: Mar. 5, 2014

(65) Prior Publication Data
US 2015/0035036 A1 Feb. 5, 2015

(30) Foreign Application Priority Data

Jul. 30, 2013 (JP) .................................. 2013-157525

(51) Int. Cl.
*H01L 29/76* (2006.01)
*H01L 27/115* (2006.01)

(52) U.S. Cl.
CPC ...... *H01L 27/11565* (2013.01); *H01L 27/1157* (2013.01); *H01L 27/11573* (2013.01); *H01L 27/11575* (2013.01); *H01L 27/11582* (2013.01)

(58) Field of Classification Search
CPC .............. H01L 27/11521; H01L 27/11524; H01L 27/11529; H01L 27/11551; H01L 27/11556; H01L 27/11578; H01L 27/11582
USPC ............................. 257/314–326; 438/257–267
See application file for complete search history.

(56) References Cited

U.S. PATENT DOCUMENTS

| | | | |
|---|---|---|---|
| 7,847,334 B2 | 12/2010 | Katsumata et al. | |
| 7,936,004 B2 | 5/2011 | Kito et al. | |
| 8,169,826 B2 | 5/2012 | Hishida et al. | |
| 8,372,720 B2 | 2/2013 | Fukuzumi et al. | |
| 2010/0213537 A1* | 8/2010 | Fukuzumi et al. | 257/326 |
| 2010/0240205 A1* | 9/2010 | Son et al. | 438/588 |
| 2011/0156132 A1 | 6/2011 | Kiyotoshi | |
| 2011/0193153 A1 | 8/2011 | Higuchi et al. | |
| 2012/0001249 A1* | 1/2012 | Alsmeier et al. | 257/319 |

FOREIGN PATENT DOCUMENTS

| | | |
|---|---|---|
| JP | 2007-266143 | 10/2007 |
| JP | 2009-146954 | 7/2009 |
| JP | 2009-224465 | 10/2009 |
| JP | 2011-40706 | 2/2011 |
| JP | 2011-165815 | 8/2011 |
| JP | 2011-165972 | 8/2011 |

* cited by examiner

*Primary Examiner* — Brook Kebede
(74) *Attorney, Agent, or Firm* — Oblon, McClelland, Maier & Neustadt, L.L.P.

(57) ABSTRACT

According to an aspect of the invention, a first insulating layer is buried in a first trench provided in at least one of an interstice between first and second semiconductor pillars, a side surface portion of the first semiconductor pillar opposed to the second semiconductor pillar, and a side surface portion of the second semiconductor pillar opposed to the first semiconductor pillar. A first trench penetrates each stack from an uppermost portion of the stack to a first conductive layer in a lowermost portion of the stack. The first trench is arranged away from a first connection portion. Each of the first conductive layers in contact with the first insulating layer includes a silicide layer.

14 Claims, 21 Drawing Sheets

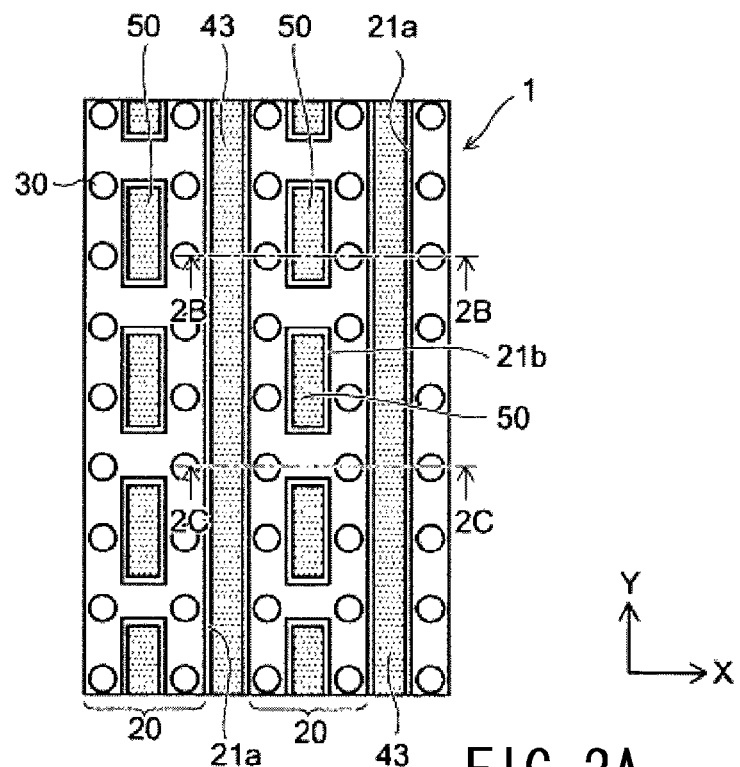
FIG. 2A
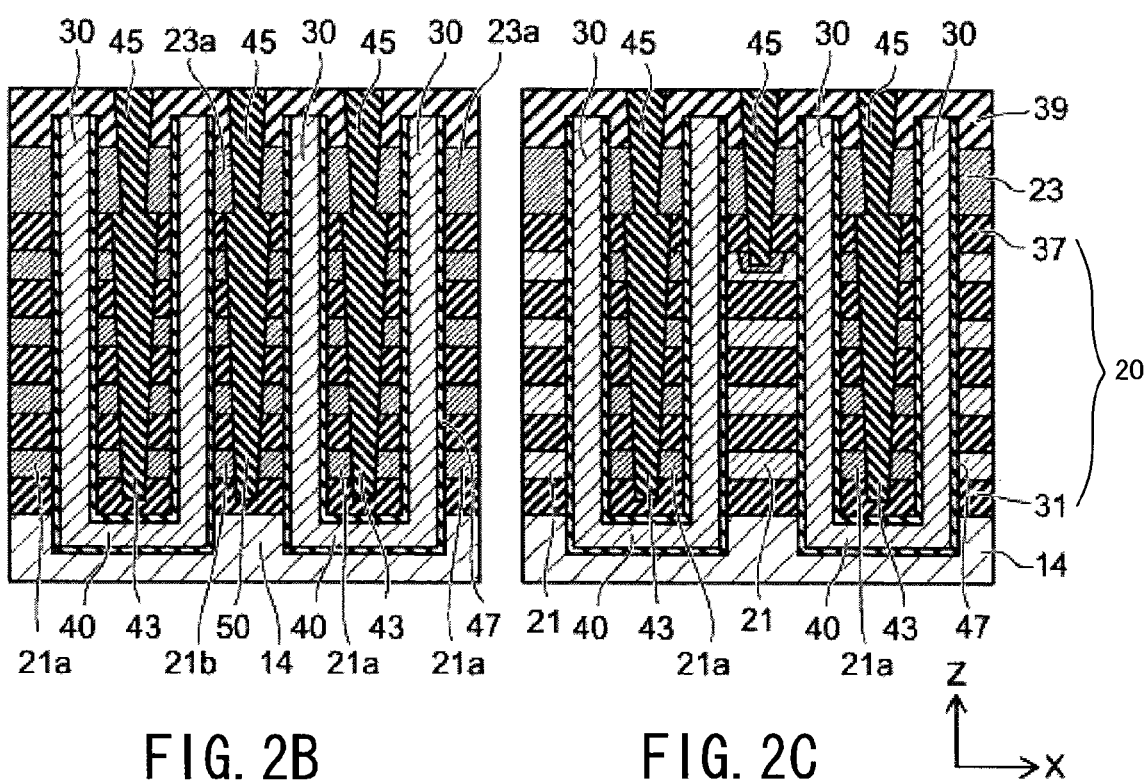
FIG. 2B
FIG. 2C

NONVOLATILE SEMICONDUCTOR MEMORY DEVICE AND METHOD OF FABRICATING THE SAME

CROSS REFERENCE TO RELATED APPLICATION

This application is based upon and claims the benefit of priority from the prior Japanese Patent Application No. 2013-157525, filed on Jul. 30, 2013, the entire contents of which are incorporated herein by reference.

FIELD

Embodiments described herein relate to a nonvolatile semiconductor memory device and a method of fabricating the nonvolatile semiconductor memory device.

BACKGROUND

Nonvolatile semiconductor memory devices represented by NAND flash memories are manufactured by using semiconductor wafer processes. An increase in capacity and a reduction in power consumption and cost of the nonvolatile semiconductor memory devices have been realized in parallel with progress in two-dimensional miniaturization techniques for the wafer processes. On the other hand, memory devices that include a three-dimensional memory array having a plurality of memory layers laid on each other are being developed as next-generation nonvolatile memory devices. In order to increase the capacity of a three-dimensional memory cell array, it is necessary to miniaturize a plurality of word lines controlling memory cells and increase the number of stacks in the memory cell array. However, the miniaturization of the word lines and the increased number of stacks could cause the stacked structure of the memory cell array to collapse in some cases.

BRIEF DESCRIPTION OF THE DRAWINGS

FIGS. 2A to 2C are diagrams illustrating a memory cell array of the nonvolatile semiconductor memory device according to the first embodiment;

DETAILED DESCRIPTION

Figure 1A:
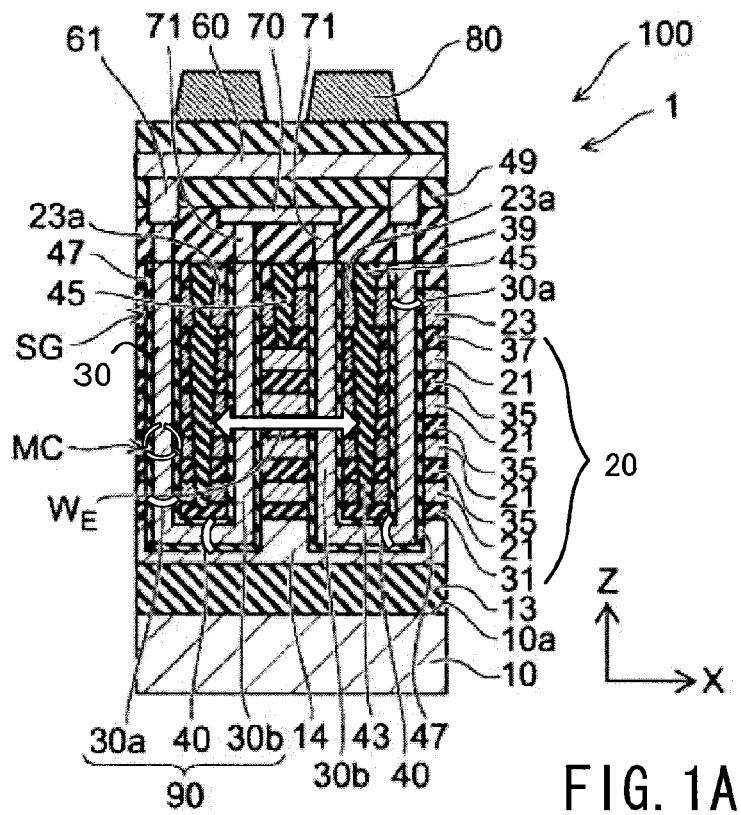
FIGS. 1A and 1B are cross-sectional views illustrating a nonvolatile semiconductor memory device according to a first embodiment.

According to an aspect of the invention, a nonvolatile semiconductor memory device includes a plurality of stacks, a plurality of first memory strings and a first insulating layer. The plurality stacks are arranged side by side in a first direction, and extend in a second direction orthogonal to the first direction, in a plane in parallel with a substrate. Each stack includes a plurality of first conductive layers stacked above the substrate with insulating layers interposed between the first conductive layers. The plurality of first memory strings include a first semiconductor pillar, a second semiconductor pillar and a first connection portion, respectively. The first and second semiconductor pillars penetrate each stack in a way to reach a back gate layer above the substrate. The first connection portion is provided in a surface of the back gate layer. One end of the first connection portion is connected to a lower end of the first semiconductor pillar. The other end of the first connection portion is connected to a lower end of the second semiconductor pillar. A memory layer is provided in an outer side portion of the first semiconductor pillar, the second semiconductor pillar and the first connection portion. A first semiconductor layer is provided in an inner side portion of the first semiconductor pillar, the second semiconductor pillar and the first connection portion. The plurality of first memory strings are arranged side by side in the second direction. A first insulating layer is buried in a first trench provided in at least one of an interstice between the first and second semiconductor pillars, a side surface side of the first semiconductor pillar opposed to the second semiconductor pillar, and a side surface side of the second semiconductor pillar opposed to the first semiconductor pillar, in the first direction. The first trench penetrates each stack from an uppermost portion of the stack to the first conductive layer in a lowermost portion of the stack. The first trench is arranged away from the first connection portion. The first trenches are arranged side by side in the second direction. Each of the first conductive layers in contact with the first insulating layer includes a silicide layer.

Hereinafter, embodiments of the invention will be described with reference to the drawings. The same portions are given the same numerals in the drawings, and detailed description of the same portions is properly omitted. Only different portions will be described. The drawings are schematic or conceptual, and the relationship between the thickness and width of each portion, the size proportions among portions, and the like are not always equal to the actual ones. Even the same portions are shown with dimensions or proportions different from one drawing to another.

Figure 1B:
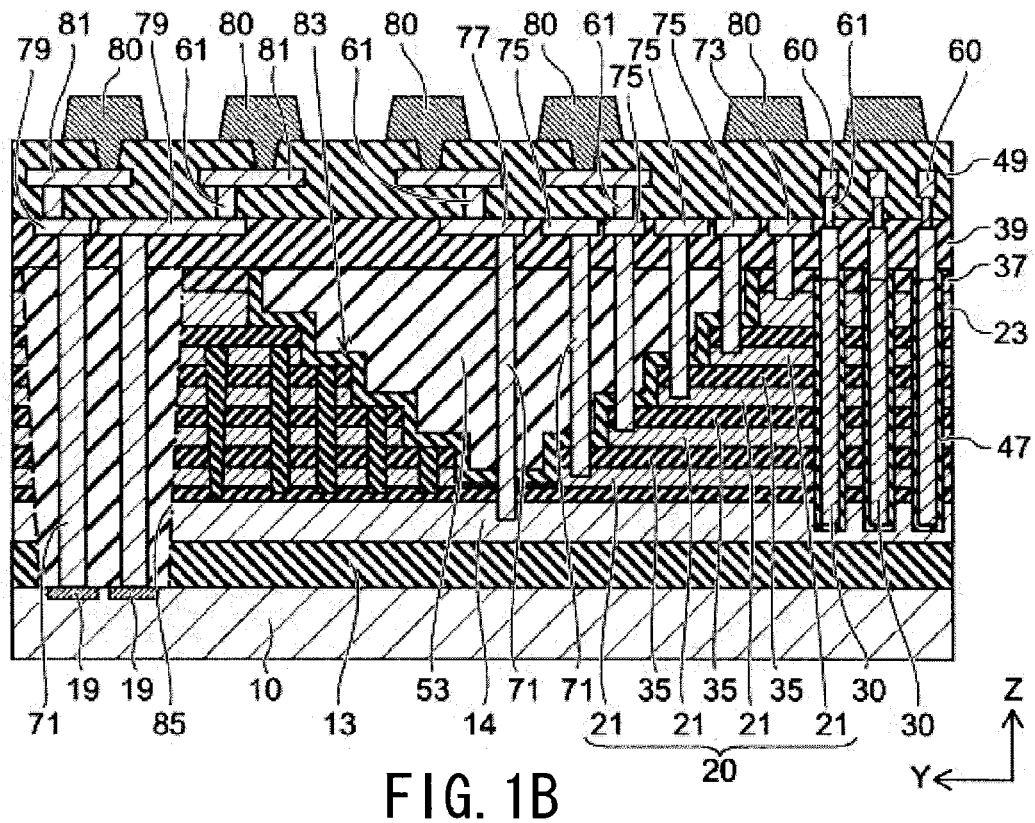

A nonvolatile semiconductor memory device according to a first embodiment and a method of fabricating the nonvolatile semiconductor memory device will be described with reference to the drawings. FIGS. 1A and 1B are cross-sectional views illustrating the nonvolatile semiconductor memory device according to the first embodiment. As illustrated in FIGS. 1A and 1B, the nonvolatile semiconductor memory device 100 is a three-dimensional NAND flash memory, and includes a three-dimensionally structured memory cell array 1. FIG. 1A is a diagram illustrating a cross section of the memory cell array 1 which is vertical to the word lines. FIG. 1B is a diagram illustrating a cross section of the memory cell array 1 which is in parallel to the extension direction of the word lines.

As illustrated in FIG. 1A, the nonvolatile semiconductor memory device 100 includes the memory cell array 1 provided on a substrate 10 with an interlayer insulating layer 13 interposed in between. The memory cell array 1 includes memory strings 90 arranged side by side. Each memory string 90 includes a semiconductor pillar 30a, a semiconductor pillar 30b, and a connection portion 40. Each memory string 90 is also referred to as a NAND string.

The upper end portion of the semiconductor pillar 30a is connected to a bit line 60 via a contact plug 61 and a contact plug 71. The upper end portion of the semiconductor pillar 30b is connected to a source line 70 via a contact plug 71. The connection portion 40 is provided in the surface of a back gate layer 14. One end of the connection portion 40 is connected to the lower end portion of the semiconductor pillar 30a, and the other end of the connection portion 40 is connected to the lower end portion of the semiconductor pillar 30b. A memory layer 47 is provided in an outer side portion of the semiconductor pillar 30a, the semiconductor pillar 30b and the connection portion 40, and a semiconductor layer 30 is provided in an inner side portion of the semiconductor pillar 30a, the semiconductor pillar 30b and the connection portion 40.

In the following description, the direction perpendicular to an upper surface 10a of the substrate 10, for example, in a plane parallel to the back gate layer 14 and the substrate 10 is referred to as a direction Z, and the direction parallel to the memory strings 90 is referred to as a direction X. The direction perpendicular to the memory strings 90 is referred to as a direction Y. In some cases, the direction Z is referred to as an upward direction, and the direction opposite to the direction Z is referred to as a downward direction.

A plurality of stacks 20 is arranged side by side above the interlayer insulating layer 13 in the direction X. Each of the plurality of stacks 20 is provided in a stripe extending in the direction Y. An insulating layer 43 is provided between each two adjacent stacks 20. In each stack 20, an insulating layer 35, a conductive layer 21, an insulating layer 35, a conductive layer 21, an insulating layer 35, a conductive layer 21, an insulating layer 35, a conductive layer 21 and an insulating layer 37 are stacked in the direction Z, for example. Although the four conductive layers 21 are stacked in this case, the number of conductive layers 21 to be stacked is not limited to the four. Five or more conductive layers 21 may be stacked.

A plurality of conductive layers 23 is provided on the insulating layer 37. The conductive layers 23 are provided in a stripe extending in the direction Y, and are arranged side by side in the direction X. The adjacent conductive layers 23 are insulated from each other by an insulating layer 45 which is provided in between. In the embodiment, two conductive layers 23 are arranged side by side on each stack 20. The conductive layers 23 function as selection gate electrodes and selection gate lines.

A plurality of the semiconductor layers 30 is provided penetrating each stack 20 and the conductive layers 23 in the direction Z.

The insulating layer 43 provided between each adjacent stacks 20 is arranged away from the corresponding connection portion 40, and is provided on the connection portion 40.

The bit lines 60 and the source line 70 are multilayer interconnections provided above the conductive layers 23. Each of the bit lines 60 and the source line 70 is divided into two strata by an insulating layer 39 and an insulating layer 49. Each bit line 60 is connected to the semiconductor layers 30 in the corresponding semiconductor pillars 30a via the corresponding contact plugs 61, 71. The source line 70 is connected to the semiconductor layers 30 in the corresponding semiconductor pillars 30b via the corresponding contact plugs 71.

The memory layer 47 provided between each semiconductor layer 30 and the corresponding stack 20 is a multilayer film including a silicon oxide film and a silicon nitride film, for example, and is capable of accumulating charges injected from the semiconductor layer 30. A memory cell MC is formed from each of the plurality of conductive layers 21 in the stack 20, as well as the memory layer 47 and the semiconductor layer 30. Each conductive layer 21 functions as a control gate electrode and a word line.

The memory layer 47 is provided between each conductive layer 23 and the corresponding semiconductor layer 30. The memory layer 47 functions as a gate insulating film. A selection transistor SG is formed from the semiconductor layer 30, the conductive layer 23 and the memory layer 47, as well as controls the on and off of the electrical communication of the semiconductor layer 30.

A plurality of the memory cells MC, and the selection transistor SG above the memory cells are formed in each of the semiconductor pillar 30a and the semiconductor pillar 30b which are connected to the connection portion 40. The plurality of memory strings 90 are provided extending between the plurality of stacks 20 arranged side by side in the direction X.

As shown in FIG. 1B, the plurality of semiconductor layers 30 penetrating the stacks 20 is arranged side by side in the extension direction of the stacks 20 (in the direction Y). The plurality of memory strings 90 are arranged side by side in the direction Y. In this manner, the memory cell array 1 includes the memory strings 90 arranged side by side in the directions X, Y.

A contact portion 83 shaped like stairs is provided in an outer peripheral portion of the memory cell array 1. Ends of the plurality of conductive layers 21 extending in the direction Y are exposed from the respective steps of the contact portion 83. In this regard, the "exposed" means being in a state where upper portions are removed from the plurality of conductive layers 21 and the conductive layer 23 stacked one on another.

In addition, an insulating layer 53 is provided to fill the inside of the contact portion 83. The conductive layers 21 are electrically connected to interconnections 75 via the respective contact plugs 71 penetrating the insulating layer 53.

Each conductive layer 23 is connected to an interconnection 73 via the corresponding contact plug 71. The back gate layer 14 is exposed to a bottom portion of the contact portion 83, and is electrically connected to an interconnection 77 via the corresponding contact plug 71. As a consequence, the back gate layer 14 functions as a back gate.

A contact portion 85 communicating with the substrate 10 is provided further outside the contact portion 83. The substrate 10 is a silicon substrate, for example. A peripheral circuit to control the memory cell array 1 is provided on the upper surface 10a of the substrate 10. Terminals 19 and interconnections 79 electrically connected to the peripheral circuit in the contact portion 85 are electrically connected to each other via the corresponding contact plugs 71.

The interconnection 73, the interconnections 75, the interconnection 77, the interconnections 79, for example, are interconnections provided in the same stratum as the source line 70 is. The interconnections are connected to pad electrodes 80 on the surface of the chip via interconnections 81 provided in an upper stratum.

In the memory cell array 1 of the embodiment, the two conductive layers 23 are arranged on each stack 20. The two semiconductor layers 30 penetrating the respective conductive layers 23 and the stack 20 are arranged side by side in the direction X.

Figure 21:
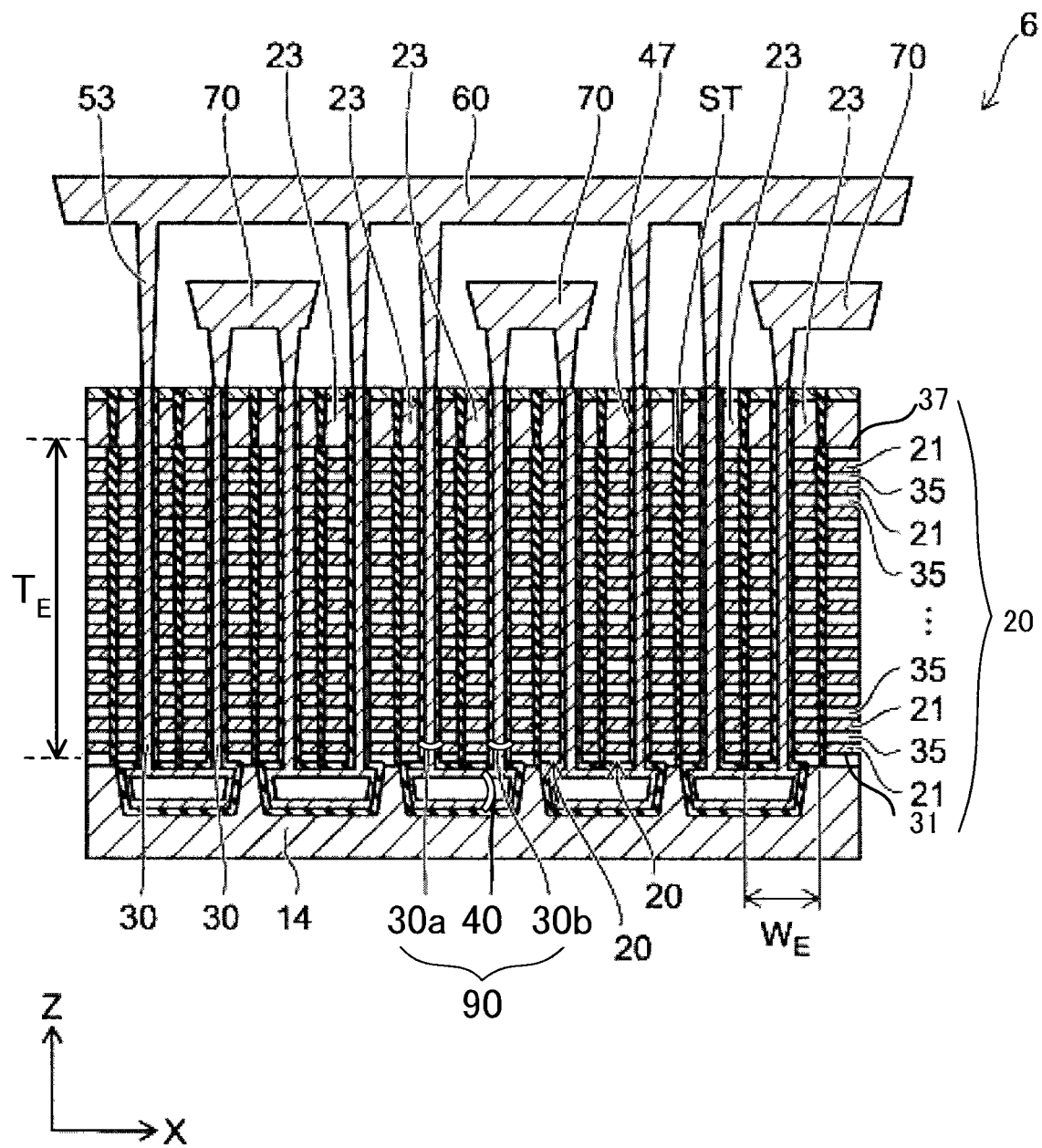
FIG. 21 is a cross-sectional view illustrating the memory cell array of the nonvolatile semiconductor memory device according to the comparative example.

FIG. 21 is a cross-sectional view illustrating a memory cell array 6 of a nonvolatile semiconductor memory device according to a comparative example. In the memory cell array 6, one conductor layer 23 is arranged on each of the stacks 20 arranged side by side on the back gate layer 14. The semiconductor layers 30 arranged side by side in the direction X are arranged in the respective stacks 20. Each connection portion 40 electrically connects the semiconductor layers 30 respectively provided in the corresponding adjacent two of the stacks 20. The connection portion 40 and the semiconductor layers 30 jointly form an NAND string 90.

One may consider that in the case where the configuration of the memory cell array 6 would be miniaturized in the X-Y plane for the purpose of increasing the storage capacity, intervals among the semiconductor layers 30 in the memory cell array 6 would become equal to those among the semiconductor layers 30 in the memory cell array 1. As a result, the width $W_E$ of each stack 20 in the direction X in the memory cell array 6 would become not greater than half the width $W_E$ of each stack 20 in the direction X in the memory cell array 1. As a result, the embodiment can hold the width $W_E$ of each stack 20 wide while increasing the storage capacity of the memory cell array 1.

The increase in the storage capacity of a three-dimensionally structure memory cell array is achieved not only by the two-dimensional miniaturization in the X-Y plane, but also by increasing the number of conductive layers 21 to be stacked in the direction Z. As a result, the aspect ratio (Height $T_E$/Width $W_E$) tends to become larger as the storage capacity becomes larger. Consequently, a stack 20 including a larger number of conductive layers 21 becomes more likely to collapse during the fabrication process. In contrast, the embodiment holds the width $W_E$ of each stack 20 wide, and accordingly can inhibit the stack 20 from collapsing.

On the other hand, when a conductive layer 21 (a word line) is miniaturized, the electric resistance of the conductive layer 21 becomes larger in the extension direction (the direction Y). For this reason, the silicidization of the end portion of the conductive layer 21 is used as a method of reducing the electric resistance of the conductive layer 21. In the memory cell array 6, for example, since the width $W_E$ of each stack 20 is narrower, most portions of each of the conductive layers 21 included in the stack 20 are silicidized. Thereby, the electric resistance of each conductive layer 21 can be decreased.

FIGS. 2A to 2C are diagrams illustrating the memory cell array 1 of the nonvolatile semiconductor memory device according to the first embodiment. FIG. 2A is a top view illustrating a stack. FIG. 2B is a cross-sectional view of the stack taken along the 2B-2B line of FIG. 2A. FIG. 2C is a cross-sectional view of the stack taken along the 2C-2C line of FIG. 2A.

As shown in FIG. 2A, in the memory cell array 1, each of the plurality of stacks 20 includes a plurality of insulating layers 50 arranged side by side in the direction Y. The insulating layers 50 are cyclically arranged in the direction Y. In other words, the widths of the insulating layers 50 in the direction Y are equal to one another, and the insulating layers 50 are arranged at the same intervals.

The insulating layer 45 to insulate the conductive layers 23 from each other is provided on each insulating layer 50. In this case, descriptions will be provided while distinguishing between the insulating layer 43 and the insulating layer 45, as well as between the insulating layer 50 and the insulating layer 45, for the sake of convenience. As describe later, however, the insulating layer 43, the insulating layer 45 and the insulating layer 50 are simultaneously formed by use of a silicon oxide film, for example. In other words, the insulating layer 45 and the insulating layer 50 are formed integrally, while the insulating layer 43 and the insulating layer 45 are formed integrally.

As shown in FIG. 2B, the insulating layer 50 penetrates the stack 20 in the direction Z. In addition, the stack 20 has a silicide layer in each end portion 21b in contact with the insulating layer 50. In each conductive layer 21 in the stack 20, the silicide layer is provided in the end portion 21b in contact with the insulating layer 50.

In the memory cell array 1, the silicide layer is provided in each end portion 21b in contact with the insulating layer 50 in addition to in each end portion 21a in contact with the insulating layer 43 which is provided between each adjacent two stacks 20. Each conductive layer 21 has the silicide layer both at the end portion 21a and the end portion 21b in contact with the insulating layer 50. As a result, the electric resistance of the conductive layer 21 can be reduced, and the stack 20 can be inhibited from collapsing by widening the stack 20.

A fabrication process of the memory cell array 1 will be described with reference to FIGS. 3A to 9C. FIGS. 3A to 9C are diagrams illustrating the fabrication process of the memory cell array 1 according to the first embodiment.

Figure 3A:
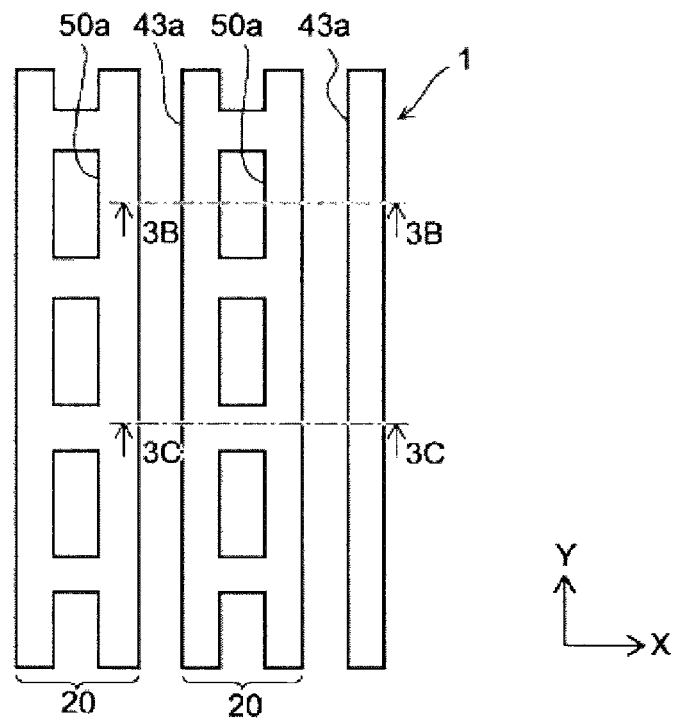
FIGS. 3A to 3C are diagrams illustrating a fabrication process of the nonvolatile semiconductor memory device according to the first embodiment.
Figure 3B:
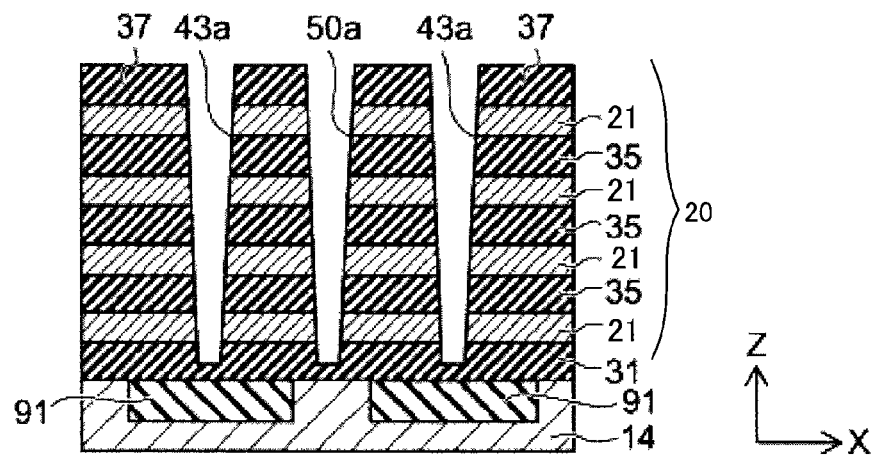
Figure 3C:
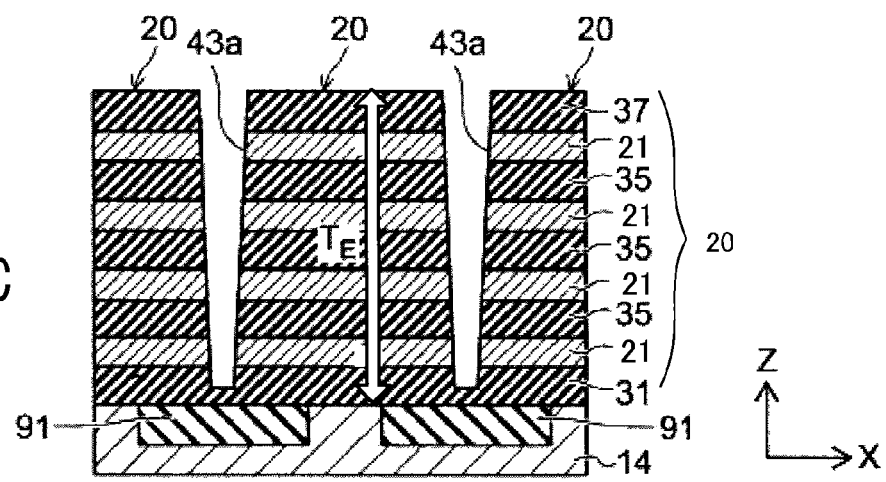

FIG. 3A is a top view illustrating a stack 20. FIG. 3B is a cross-sectional view of the stack 20 taken along the 3B-3B line of FIG. 3A. FIG. 3C is a cross-sectional view of the stack 20 taken along the 3C-3C line of FIG. 3A.

First of all, a stack 20 is formed on the back gate layer 14. Each stack 20 has a structure in which the conductive layers 21 and the insulating layers 35 are alternately stacked in the direction Z, for example. Each conductive layer 21 is composed of P-type polycrystalline silicon, for example. Each insulating layer 35 is composed of a silicon oxide film, for example. The insulating layer 31 and the insulating layer 37 are composed of any of a silicon oxide ($SiO_2$) film, a tantalum oxide ($TaO_x$) film and a stacked film ($TaO_x/SiO_2$, for example), and the like.

Sacrificial layers 91 are buried in the surface of the back gate layer 14. Each sacrificial layer 91 is composed of a silicon nitride film, for example.

Subsequently, trenches 43a reaching the insulating layer 31 are formed from the top surface of the insulating layer 37, and thereby, the stack 20 is divided into a plurality of stacks 20. As a result, each conductive layer 21 is divided into a plurality of conductive layers 21. As shown in FIG. 3A, each trench 43a extends in the direction Y, and thereby, each divided stack 20 is shaped like a stripe. The trenches 43a are formed away from the sacrificial layers 91.

Thereafter, as shown in FIG. 3B, a plurality of trenches 50a reaching the insulating layer 31 are formed from the top surface of the insulating layer 37. The plurality of trenches 50a is provided in the center of each stack 20, and are arranged side by side in the direction Y, for example. In this case, the trenches 43a and the trenches 50a are formed simultaneously.

The insulating layer 37 functions as a stopper against etching when the trenches 43a and the trenches 50a are formed.

Subsequently, sacrificial layers 93 are buried into the trenches 43a and the trenches 50a. Furthermore, a conductive layer 23 and the insulating layer 39 are formed. Each sacrificial layer 93 is composed of a silicon nitride film, for example. The silicon nitride film is buried into each of the trenches 43a and the trenches 50a by being deposited on the insulating layer 37, for example. Thereafter, the silicon nitride film is etched back in a way that the portions of the silicon nitride film formed on the inside of the trenches 43a and the trenches 50a remain.

Figure 4A:
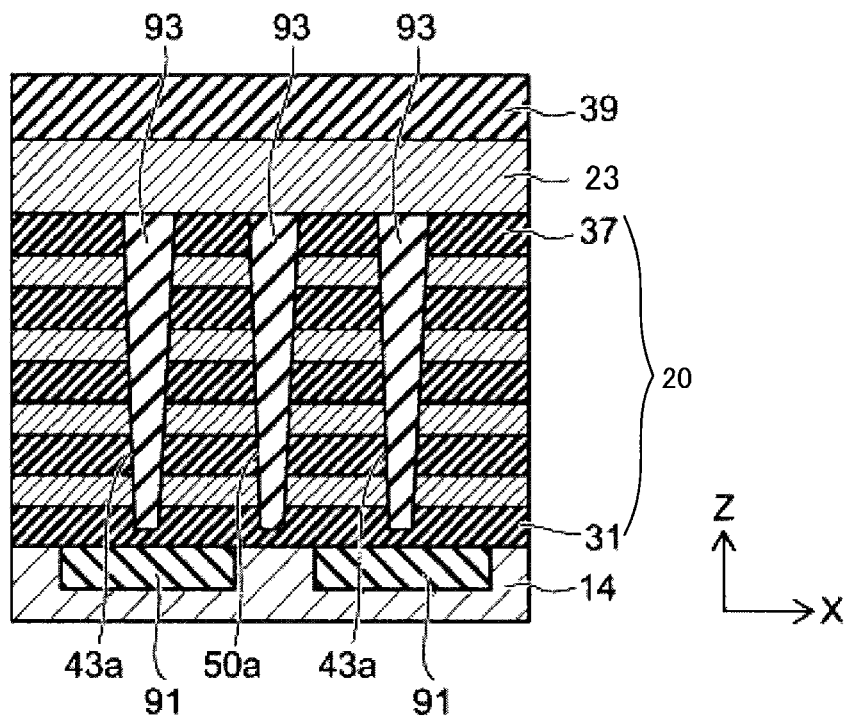
FIGS. 4A and 4B are cross-sectional views illustrating the fabrication process of the nonvolatile semiconductor memory device according to the first embodiment.
Figure 4B:
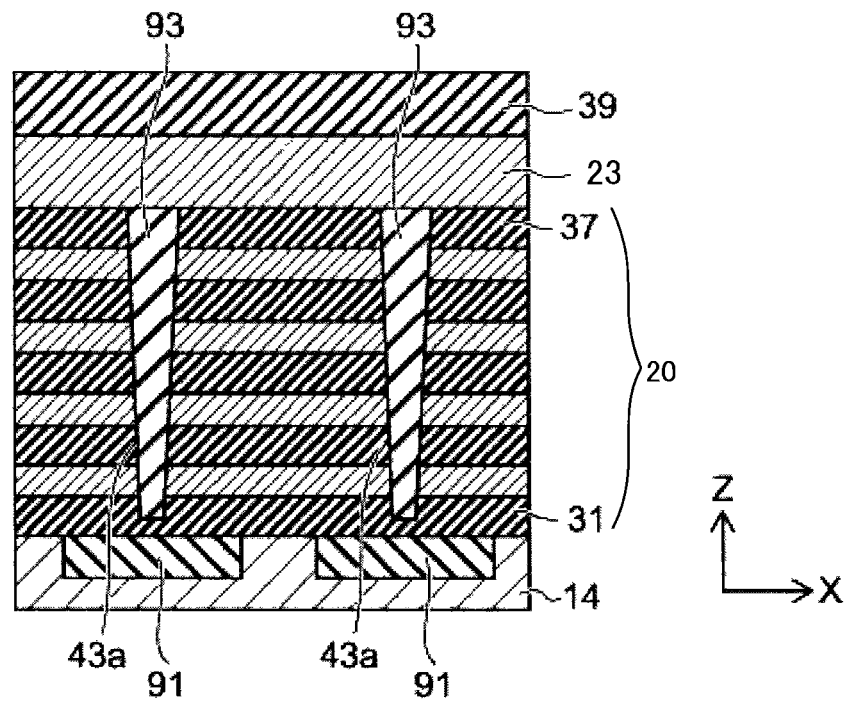

Subsequently, as shown in FIGS. 4A and 4B, the conductive layer 23 and the insulating layer 39 are deposited sequentially. FIG. 4A is a cross-sectional view of the stack 20 taken along the 3B-3B line of FIG. 3A. FIG. 4B is a cross-sectional view of the stack 20 taken along the 3C-3C of FIG. 3A. These are the cases with FIGS. 5A to 8B.

The conductive layer 23 is composed of a polycrystalline silicon film, for example, and covers the insulating layer 37 and the sacrificial layers 93. The insulating layer 39 is composed of a silicon oxide film, for example.

Figure 5A:
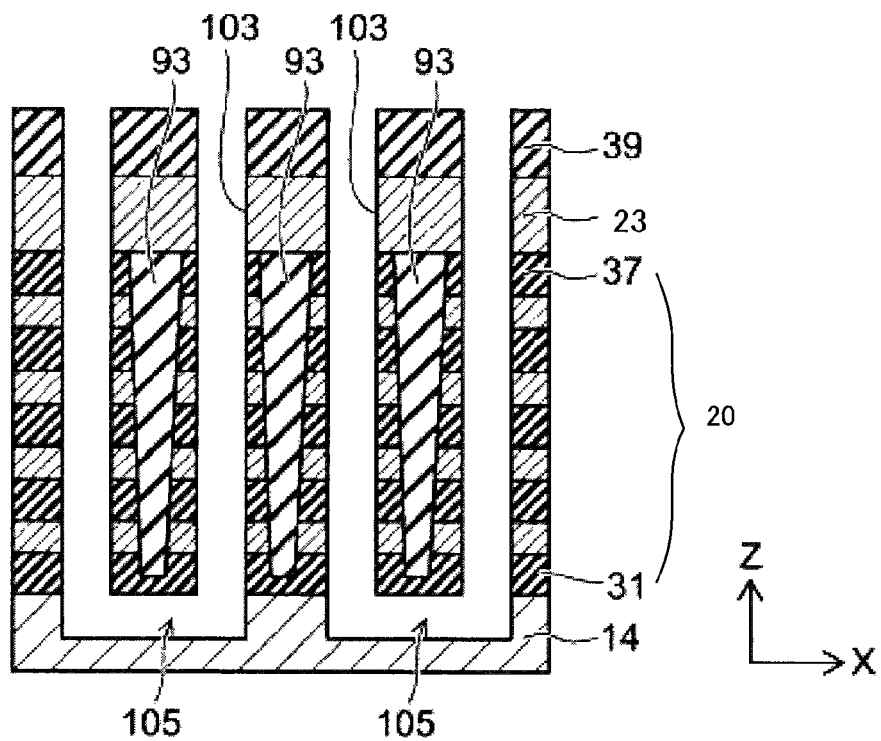
FIGS. 5A and 5B are cross-sectional views illustrating the fabrication process of the nonvolatile semiconductor memory device according to the first embodiment.
Figure 5B:
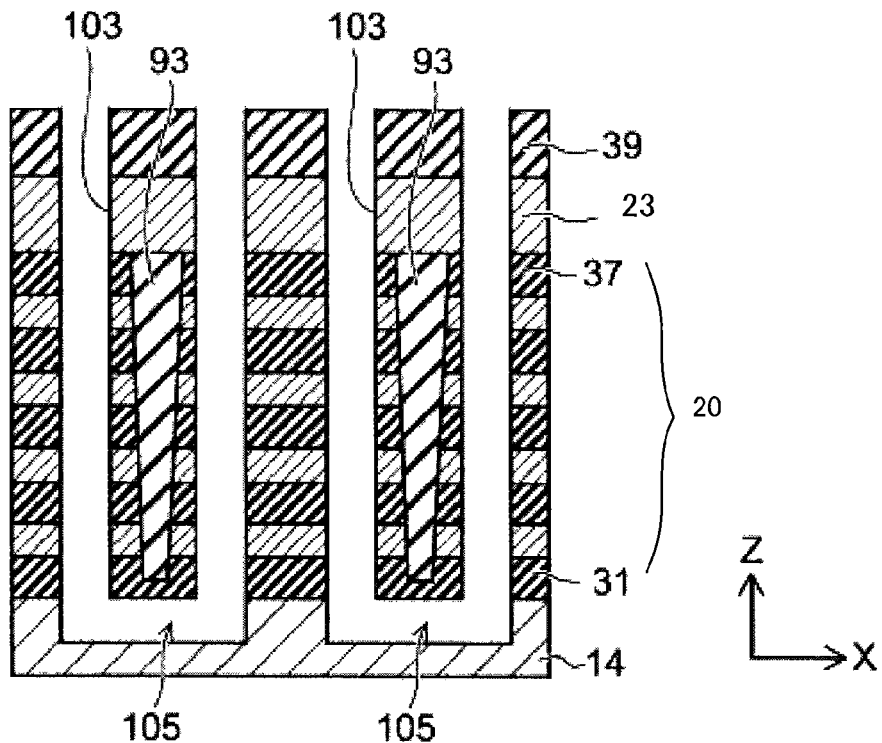

Thereafter, as shown in FIGS. 5A and 5B, memory holes 103 and connection holes 105 are formed. The memory holes 103 communicating with the sacrificial layers 91 are formed from the top surface of the insulating layer 39 by RIE (Reactive Ion Etching), for example. Subsequently, the sacrificial layers 91 are selectively etched via the memory holes 103, and thereby, the connection holes 105 are formed. As a result, each two adjacent memory holes 103 and the corresponding connection hole 105 are connected together.

Figure 6A:
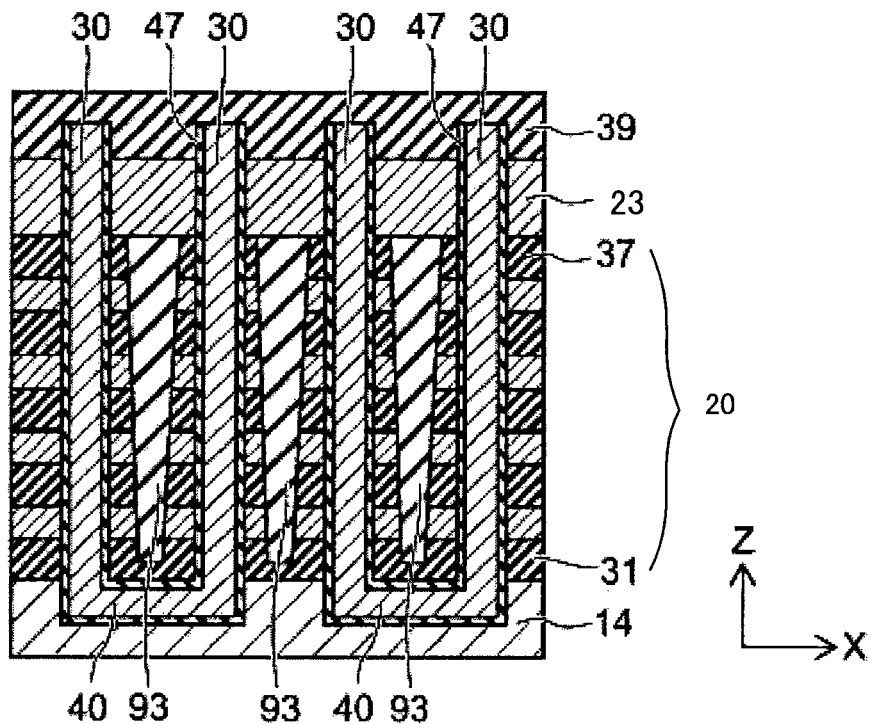
FIGS. 6A and 6B are cross-sectional views illustrating the fabrication process of the nonvolatile semiconductor memory device according to the first embodiment.
Figure 6B:
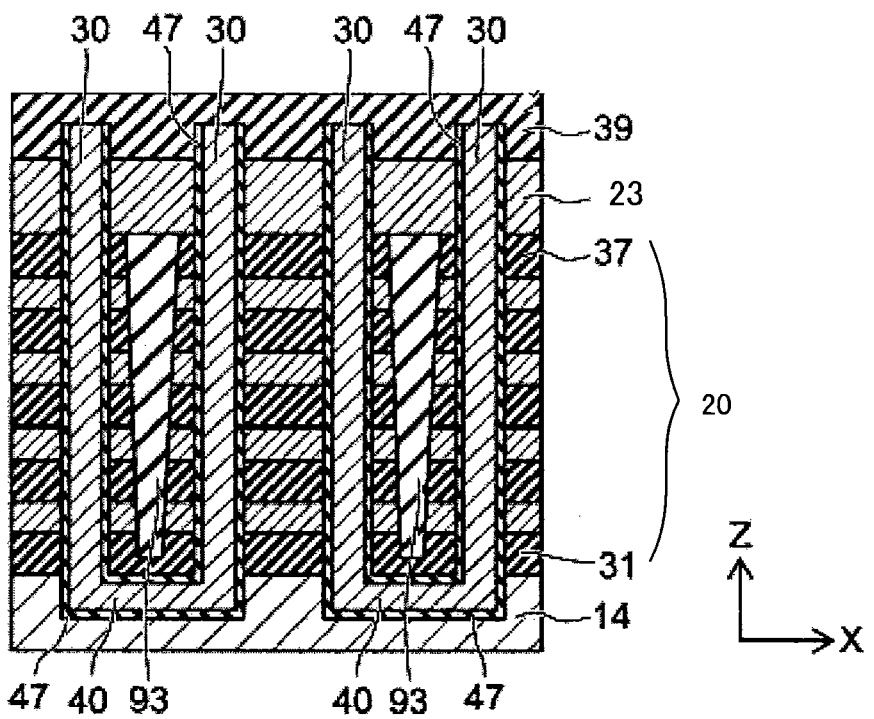

Afterward, as shown in FIGS. 6A and 6B, the memory layer 47 and the semiconductor layer 30 are formed respectively on the outer side portion and the inner side portion of each two adjacent memory holes 103 and the corresponding connection hole 105. The memory layer 47 is formed inside the two adjacent memory holes 103 and the connection hole 105 by using a CVD (Chemical Vapor Deposition) method, for example. The memory layer 47 is a three-layered film obtained by sequentially stacking a silicon oxide film, a silicon nitride film and a silicon oxide film, for example. The semiconductor layer 30 is formed on the memory layer 47 by using a CVD method, for example. The insulating layer 39 is formed to cover the insulating layer 39, the semiconductor layer 30 and the memory layer 47.

The semiconductor layer 30 is composed of undoped or phosphorus (P)-doped polycrystalline silicon, for example. In this case, the semiconductor layer 30 is formed in a way to fill the inner side portion of each of the two adjacent memory holes 103 and the connection hole 105. Instead, however, the semiconductor layer 30 may be formed in a way to leave a hollow inside the connection hole 105 and the memory holes 103, for example.

The connection portion 40 composed of P-type polycrystalline silicon, for example, is formed inside the connection hole 105. The growth of the P-type polycrystalline silicon inside the connection hole 105 is stopped at a time when the memory holes 103 are closed by the P-type polycrystalline silicon. For this reason, a hollow sometimes remains inside the connection hole 105.

Figure 7A:
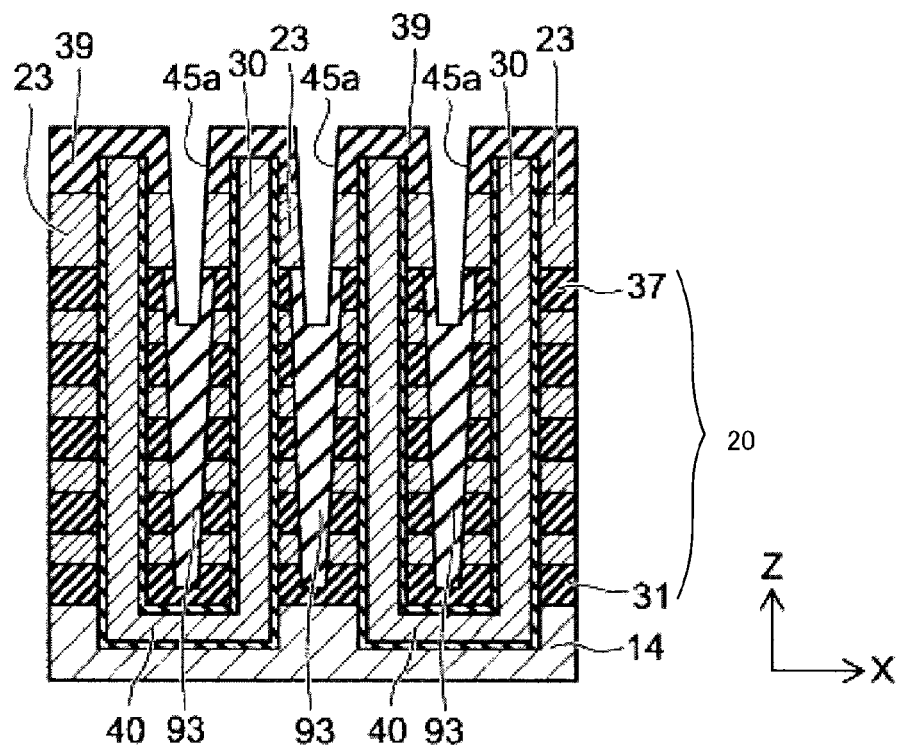
FIGS. 7A and 7B are cross-sectional views illustrating the fabrication process of the nonvolatile semiconductor memory device according to the first embodiment.
Figure 7B:
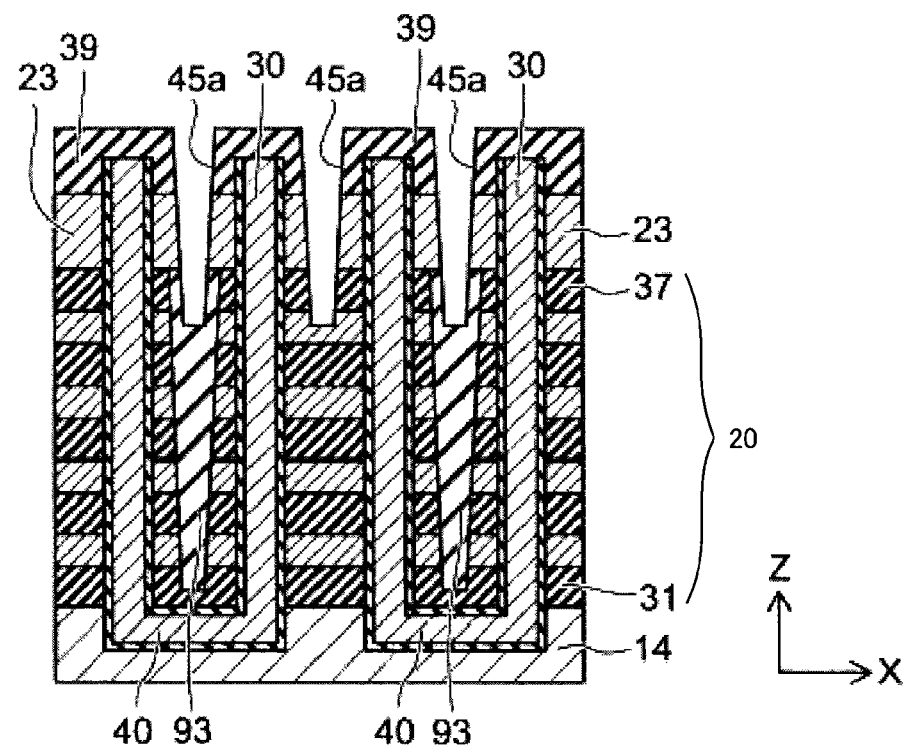

Thereafter, as shown in FIGS. 7A and 7B, trenches 45a each penetrating the insulating layer 39 and the conductive layer 23 are formed in a way to reach the corresponding sacrificial layers 93. The trenches 45a extend in the direction Y, dividing the conductive layer 23 into the plurality of pieces.

Figure 8A:
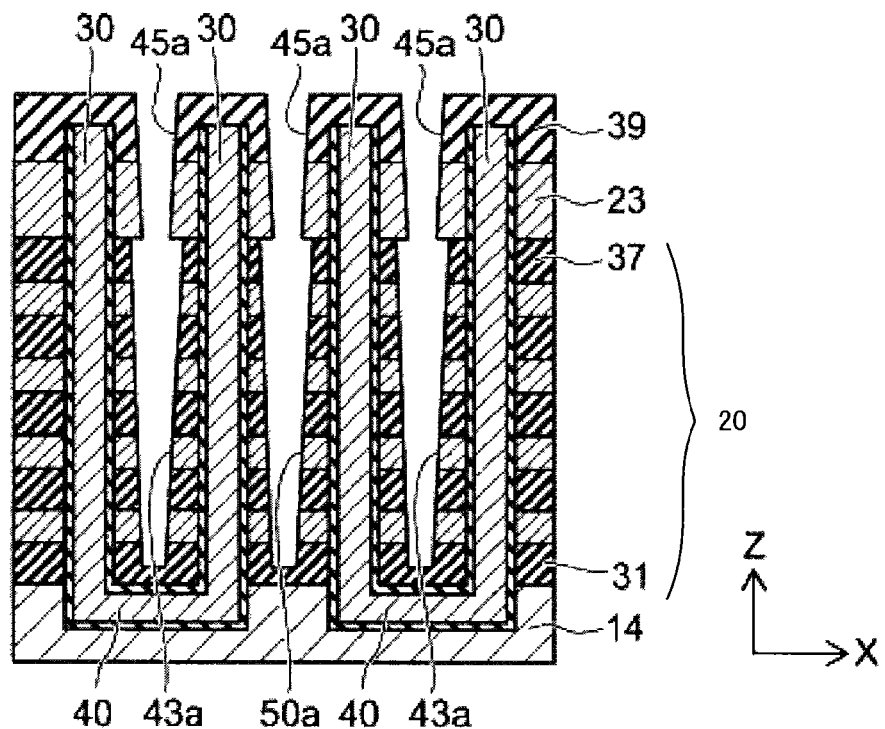
FIGS. 8A and 8B are cross-sectional views illustrating the fabrication process of the nonvolatile semiconductor memory device according to the first embodiment.
Figure 8B:
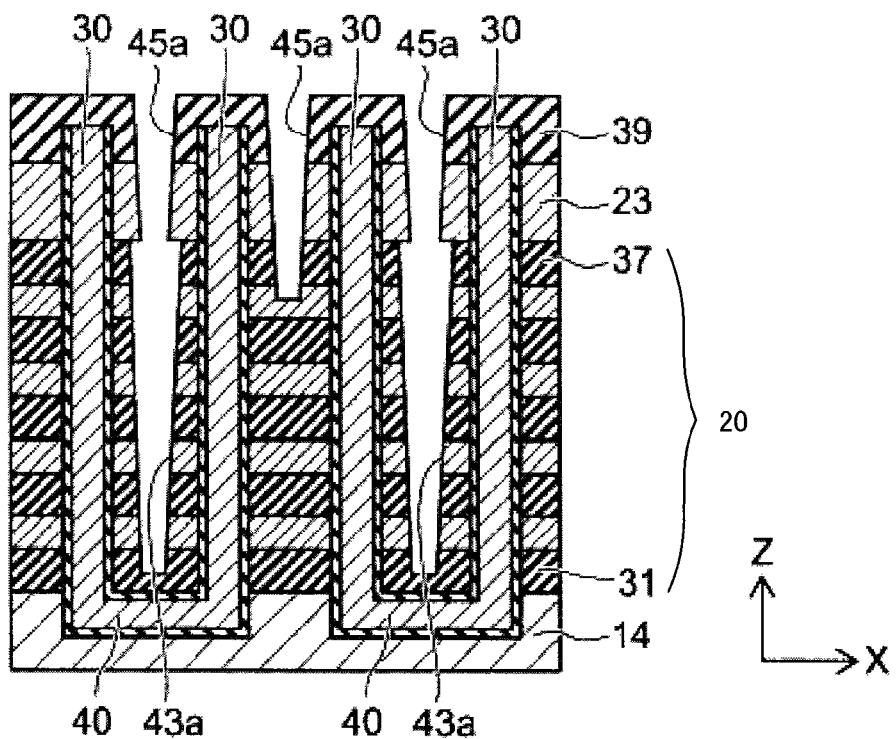

Subsequently, as shown in FIGS. 8A and 8B, the sacrificial layers 93 are selectively etched via the trenches 45a. Thereby, the trenches 43a and trenches 50a are exposed to the outside, and end portions of the conductive layers 21 inside the trenches 43a and the trenches 50a are exposed to the outside.

Figure 9A:
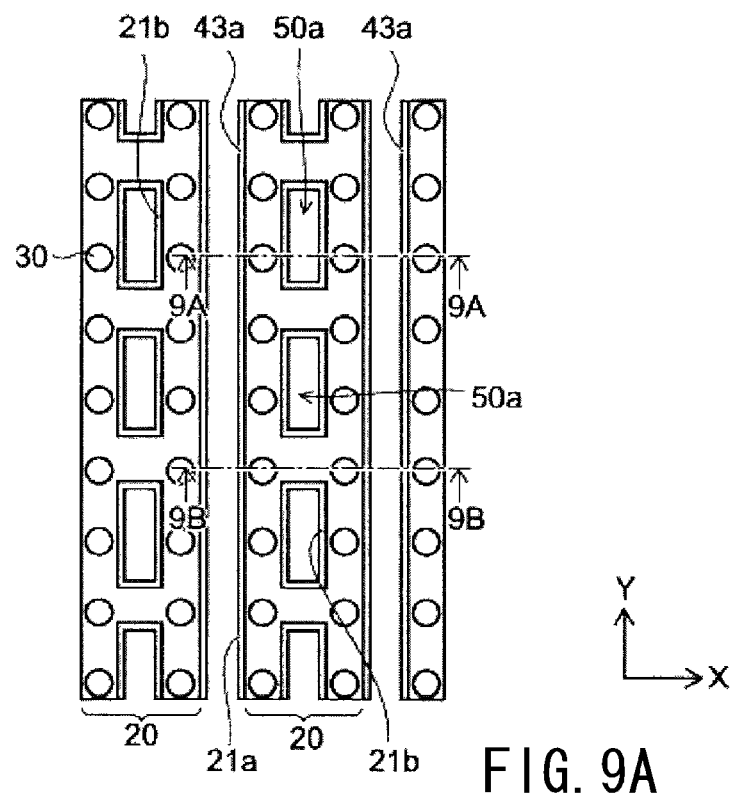
FIGS. 9A to 9C are cross-sectional views illustrating the fabrication process of the nonvolatile semiconductor memory device according to the first embodiment.
Figures 9B, 9C:
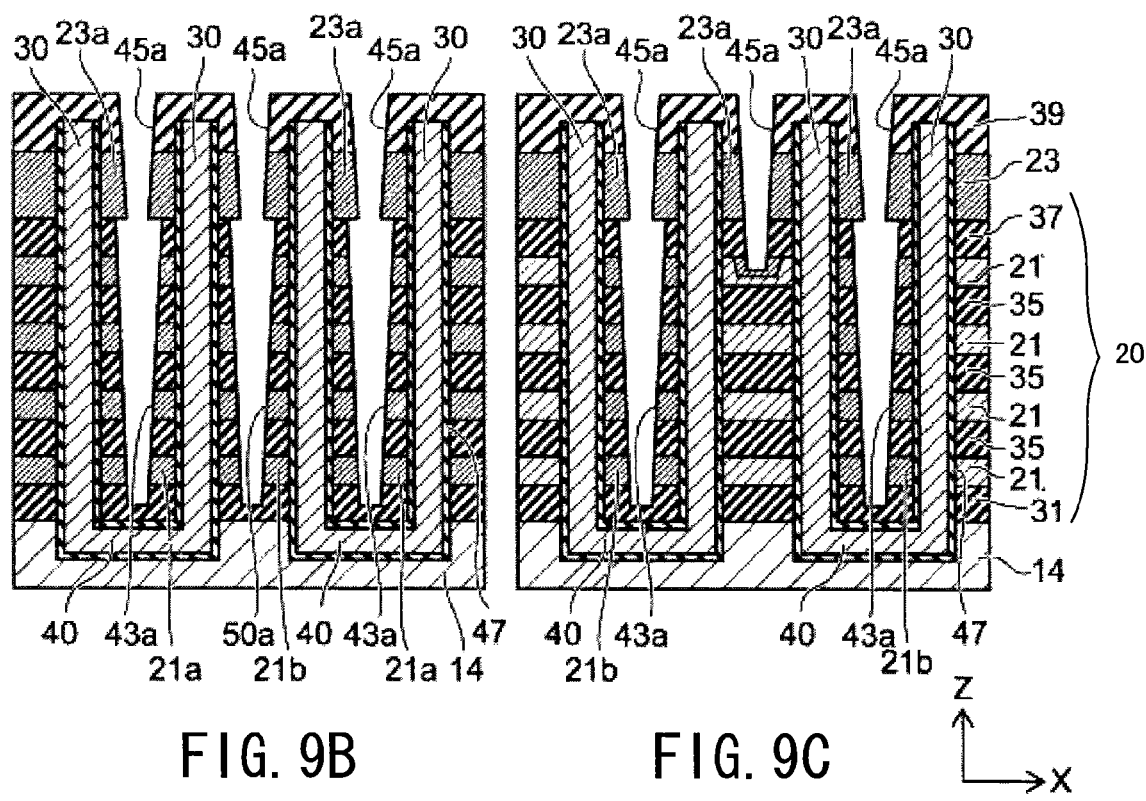

Thereafter, as shown in FIGS. 9A to 9C, the end portions 21a of the conductive layers 21, the end portions 21b of the conductive layers 21, and end portions 23a of the conductive layers 23 are silicidized. FIG. 9A is a top view illustrating the stacks 20. FIG. 9B is a cross-sectional view of the stacks 20 taken along the 9A-9A line of FIG. 9A. FIG. 9C is a cross-sectional view of the stack 20 taken along the 9B-9B line of FIG. 9A.

A nickel (Ni) film, for example, is formed on the inner surface of the trenches 43a, the trenches 45a and the trenches 50a, followed by heat treatment. As a result, as shown in FIGS. 9A to 9C, nickel silicide is formed on the end portions 21a of the conductive layers 21, and the end portions 23a of the conductive layers 23. Nickel silicide is formed also on the end portions 21b of the conductive layers 21 exposed to the inner surface of each trench 50a. The nickel adhered onto the end surfaces of the insulating layer 31, the insulating layers 35, the insulating layer 37 and the insulating layer 39 does not react with the insulating layers, and remains as the metallic nickel. For this reason, the nickel adhered onto the end surfaces of the insulating layer 31, the insulating layers 35, the insulating layer 37 and the insulating layer 39 can be removed by wet treatment, for example.

In this case, nickel (Ni) is used for the silicidization. Instead, however, cobalt (Co), titanium (Ti), tantalum (Ta), tungsten (W) or the like may be used.

Subsequently, a silicon oxide film or a silicon nitride film, for example, is buried into the trenches 43a, the trenches 45a and the trenches 50a. As a result, the insulating layers 43, the insulating layers 45 and the insulating layers 50 shown in FIGS. 2A to 2C are formed.

Figure 10:
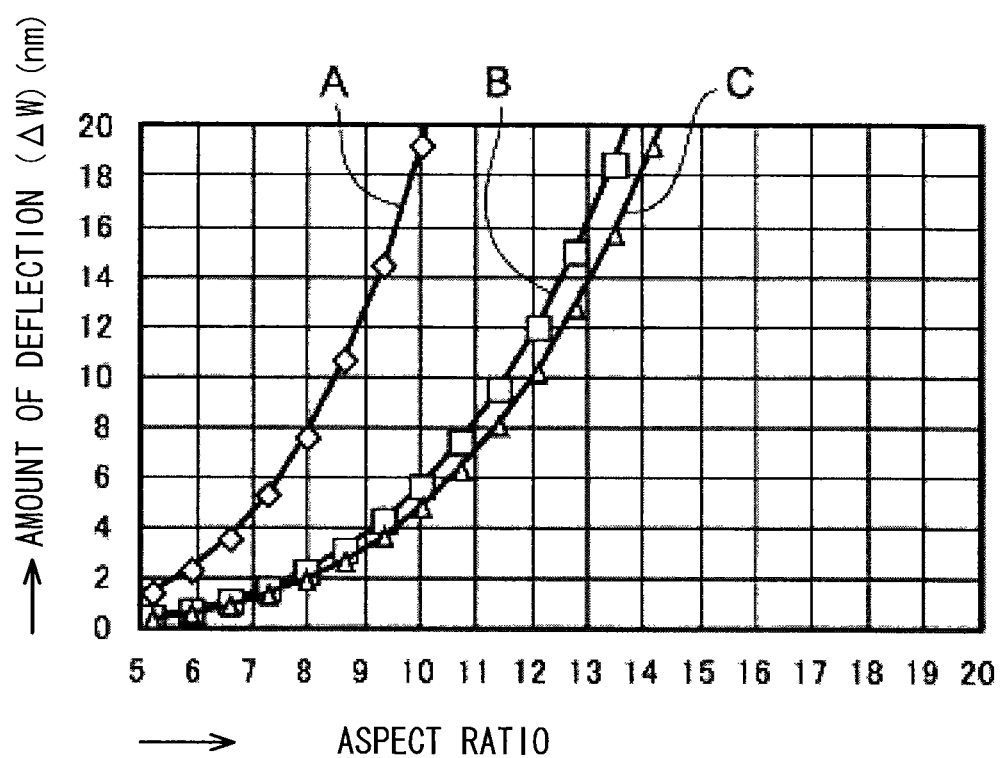
FIG. 10 is a diagram showing a characteristic of the nonvolatile semiconductor memory device according to the first embodiment.
Figure 11A:
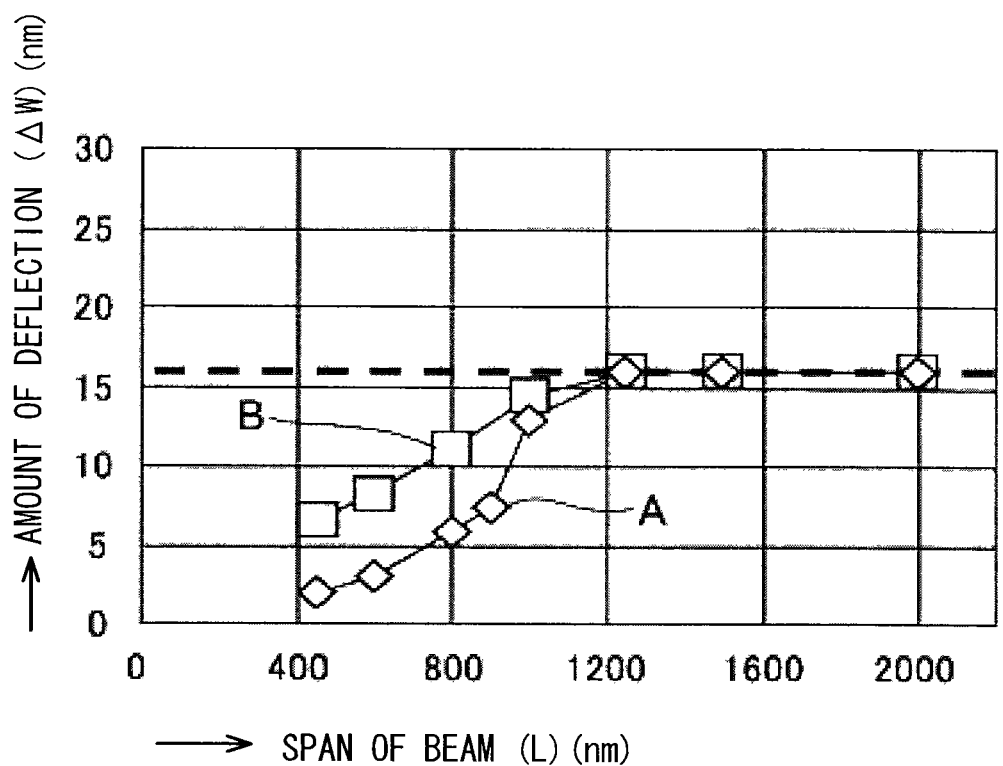
FIGS. 11A and 11B are diagrams showing other characteristics of the nonvolatile semiconductor memory device according to the first embodiment.
Figure 11B:
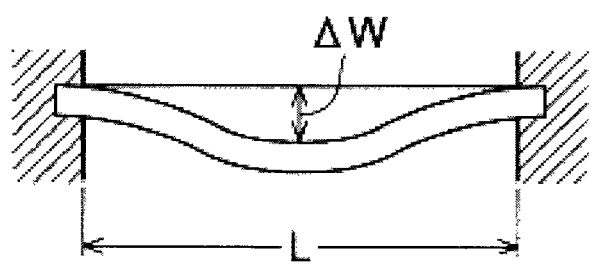

FIGS. 10, 11A and 11B are diagrams showing characteristics of the nonvolatile semiconductor memory device according to the first embodiment.

When the number of stacked conductive layers 21 is increased for the purpose of increasing the capacity of the memory cell array 1, the aspect ratio of the stacks 20 becomes larger. Accordingly, the stacks 20 deform due to the surface tension of the process liquid after trenches to isolate the stacks 20 from one another are formed, or while the wet treatment is carried out after the silicide is formed on the sidewalls of the stacks 20. As a result, the adjacent stacks 20 are more likely to come into contact with one another, or to collapse against one another.

FIG. 10 shows relationships between an aspect ratio and a deformation of a stack 20 which occurs when the stack 20 is dipped into isopropyl alcohol (IPA) and while the stack 20 is dried. The horizontal axis represents an aspect ratio, while the vertical axis represents an amount of deformation. A solid line A represents the amount of deformation of a silicon oxide film in the shape of a column having the same size as the stack 20. A solid line B represents the amount of deformation of silicon in the shape of a column having the same size of the stack 20. A solid line C represents the amount of deformation of a silicon nitride film in the shape of a column having the same size as the stack 20.

A relationship between the amount of deformation and the aspect ratio exhibits a characteristic between the solid lines A, B when the conductive layers 21 are formed from polycrystalline silicon and the insulating layers 35 are formed from a silicon oxide film. When the intervals among the adjacent stacks 20 are set at 30 nm, each stack 20 becomes more likely to collapse when the amount of deformation becomes approximately 15 nm. In other words, when the aspect ratio becomes 10 to 12, the adjacent stacks 20 become highly likely to come into contact with one another. For this reason, it is desirable that the aspect ratio be set equal to or less than 10 in order to avoid the collapse of the stacks 20.

A relationship between the amount of deformation and the aspect ratio exhibits a characteristic between the solid lines B, C when the conductive layers 21 are formed from polycrystalline silicon and the insulating layers 35 are formed from a silicon nitride film. To put it specifically, when the intervals among the adjacent stacks 20 are set at 30 nm, the adjacent stacks 20 become highly likely to come into contact with one another when the aspect ratio becomes approximately 13. In this case, it is desirable that the aspect ratio be set equal to or less than 12 in order to avoid the collapse of the stacks 20.

FIG. 11A shows a result of a simulation of a relationship between a length of a stack 20 and an amount of deformation on the basis of a model in which the two ends of the stack 20 in the extension direction are fixed. In other words, FIG. 11A shows a relationship between an amount ΔW of deformation and a span L of the beam whose two ends are fixed. The horizontal axis represents the span L, while the vertical axis represents the amount of deformation. FIG. 11B shows how the beam deforms when even force is applied to the beam whose two ends are fixed.

The solid line A shown in FIG. 11A represents a deformation characteristic when the intervals among the adjacent stacks 20 are set at 35 nm. The solid line B represents a deformation characteristic when the intervals among the adjacent stacks 20 are set at 25 nm. External force such as surface tension, which is applied among the stacks 20 during the wet treatment, for example, depends on the intervals among the adjacent stacks 20. The external force becomes smaller as the intervals become wider. In line with this, the external force applied to the beam is smaller in the example shown by the solid line A than in the example shown by the solid line B, and the amount of deformation is smaller in the example shown by the solid line A than in the example shown by the solid line B.

As shown in FIG. 11A, after the span L exceeds 1200 nanometers (nm), the amount ΔW of deformation represented by the solid lines A, B becomes constant at 16 nm. When the intervals among the adjacent stacks 20 are equal to or greater than 32 nm, no stacks come into contact with one another, and accordingly, no stacked electrodes collapse. In other words, in the example shown by the solid line A, no stacks 20 collapse. On the other hand, when the intervals among the adjacent stacks 20 are set at 25 nm, it is learned that the stacks 20 collapse in the case where the span L is set equal to or greater than 800 nm.

The result of the simulation shown in FIG. 11A suggests what should be a relationship between the amount ΔW of deformation and a width of each trench 50a, provided in each stack 20, in the direction Y. The result of the simulation suggests that it is desirable that the span L (the width of the trench 50a in the direction Y) be set narrower as the intervals among the stacks 20 become narrower for increasing the capacity of the memory cell array. The result says that it is desirable that the width of each trench 50a be set equal to or less than 800 nm in a case where the intervals among the stacks 20 are set equal to or less than 25 nm.

Figure 12:
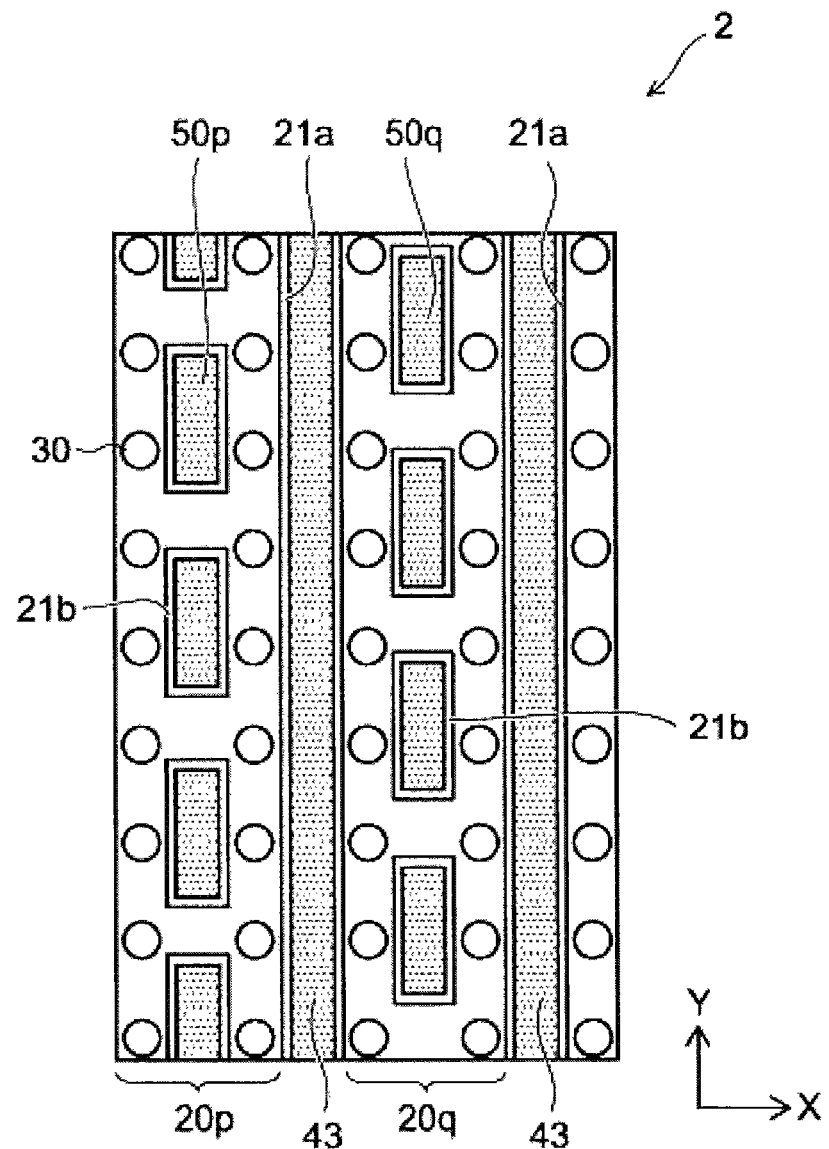
FIG. 12 is a top view illustrating a memory cell array of a nonvolatile semiconductor memory device according to a first modification.

FIG. 12 is a top view illustrating a memory cell array 2 according to a first modification of the first embodiment, and shows a plane configuration of stacks 20.

In the example shown in FIG. 12, the insulating layers 50p provided in a stack 20p are arranged in the same cycles as the insulating layers 50q in a stack 20q, while the locations of the insulating layers 50q are shifted from the locations of the insulating layers 50p in the direction Y. The plurality of insulating layers 50 arranged in one of each two adjacent stacks 20 have the same cycles as the plurality of insulating layers 50 arranged in the other of the two adjacent stacks 20, but has a phase which is different from that of the other. In addition, how the insulating layers 50 are arranged is arbitrary. The insulating layers 50 may be arranged without cycles in the direction Y, for example.

Figure 13A:
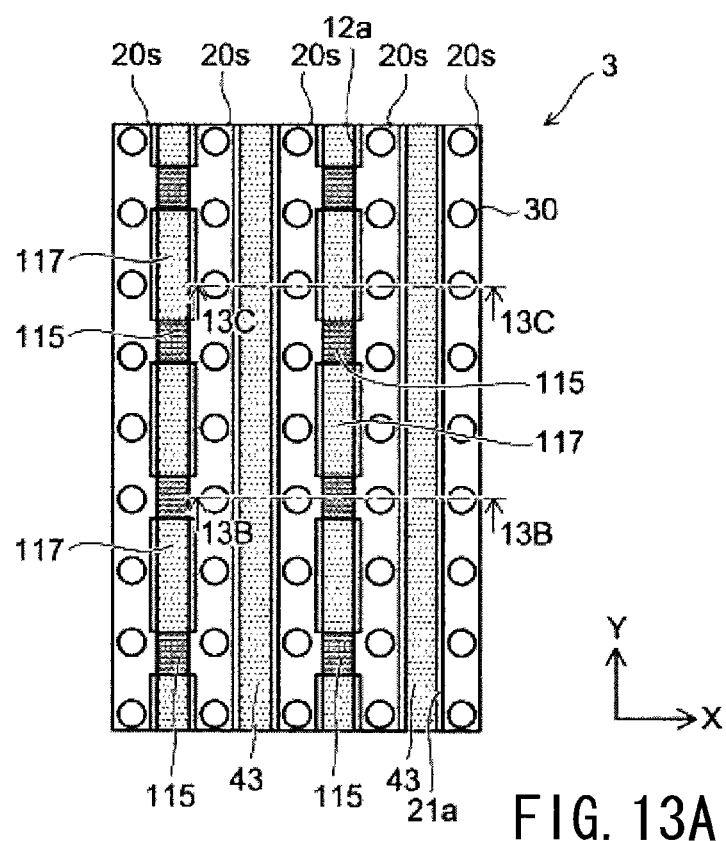
FIGS. 13A to 13C are cross-sectional views illustrating a memory cell array of a nonvolatile semiconductor memory device according to a second embodiment.
Figures 13B, 13C:
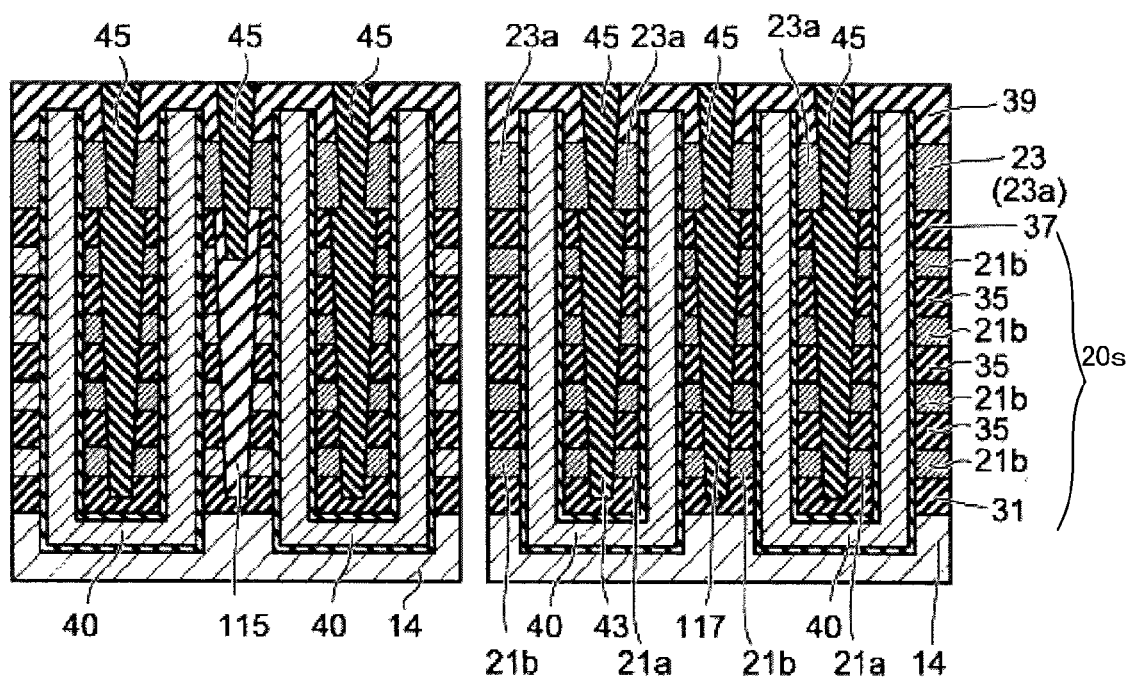

A nonvolatile semiconductor memory device according to a second embodiment and a method of fabricating the nonvolatile semiconductor memory device will be described with reference to FIGS. 13A to 13C. FIGS. 13A to 13C are diagrams illustrating a memory cell array 3 according to the second embodiment. FIG. 13A is a top view illustrating stacks 20s. FIG. 13B is a cross-sectional view of the stacks 20s taken along the 13B-13B line of FIG. 13A. FIG. 13C is a cross-sectional view of the stacks 20s taken along the 13C-13C line of FIG. 13A.

As shown in FIG. 13A, the memory cell array 3 includes a plurality of stacks 20s and a plurality of semiconductor layers 30. The stacks 20s are arranged side by side in the direction X, and extend in the direction Y. In each stack 20s, the plurality of semiconductor layers 30 are arranged side by side in the direction Y.

As shown in FIG. 13B, each stack 20s includes a plurality of conductive layers 21 stacked in the direction Z. Each semiconductor layer 30 penetrates the corresponding stacks 20s in the direction Z. A memory layer 47 is provided between each conductive layer 21 and each semiconductor layer 30. Each two semiconductor layers 30 respectively penetrating each two adjacent stacks 20s are electrically connected together via a corresponding connection portion 40.

As shown in FIGS. 13B and 13C, an insulating layer 43 is provided between each two adjacent stacks 20s above the corresponding connection portion 40. An insulating layer 115 or an insulating layer 117 is provided on the opposite side of each stack 20s from the insulating layer 43.

Each insulating layer 115 and each insulating layer 117 are in contact with a side surface of the corresponding stack 20s which is opposite from a side surface in contact with the insulating layer 43.

Each stack 20s includes the plurality of conductive layers 21 stacked in the direction Z. In addition, silicide is included in an end portion 21a of each conductive layer 21 in contact with the insulating layer 43, and an end portion 21b of the conductive layer 21 in contact with the insulating layers 117. The end portion 21a in contact with the insulating layer 43 is provided continuously in the direction Y. On the other hand, the end portion 21b in contact with the insulating layers 117 is provided discontinuously in the direction Y. The silicide included in the end portion 21a in contact with the insulating layer 43 is provided continuously, while the silicide included in the end portion 21b in contact with the insulating layers 117 is provided discontinuously.

In the memory cell array 3, each two adjacent stacks 20s support each other with the assistance of the insulating layers 115 which are provided in between. As a result, it is possible to obtain an effect of decreasing the aspect ratio of each stack 20s substantially, and to prevent the stack 20s from collapsing. The silicide provided in the end portion 21a in contact with the insulating layer 43 and in the end portion 21b in contact with the insulating layers 117 reduces the electric resistance of each conductive layer 21.

Next, a fabrication process of the memory cell array 3 will be described with reference to FIGS. 14A to 17C. FIGS. 14A to 17C are diagrams illustrating the fabrication process of the memory cell array 3 according to the second embodiment.

Figure 14A:
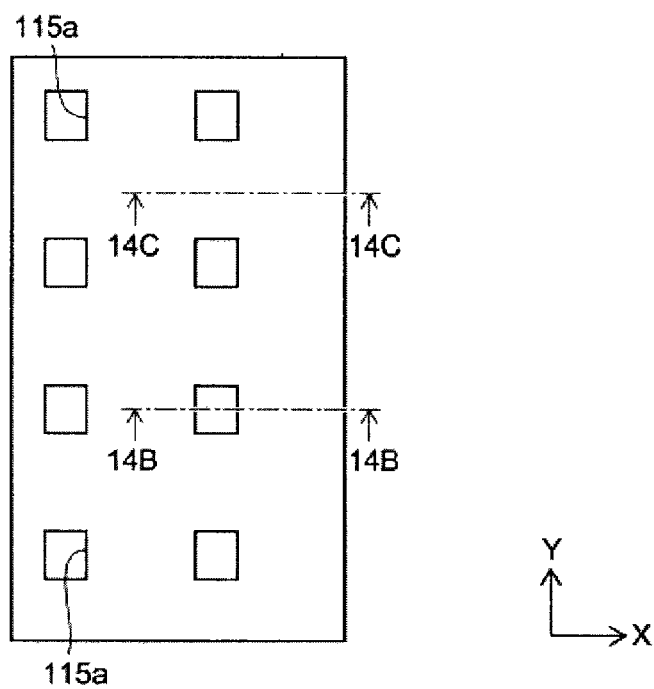
FIGS. 14A to 14C are diagrams illustrating a fabrication process of the nonvolatile semiconductor memory device according to the second embodiment.
Figure 14B:
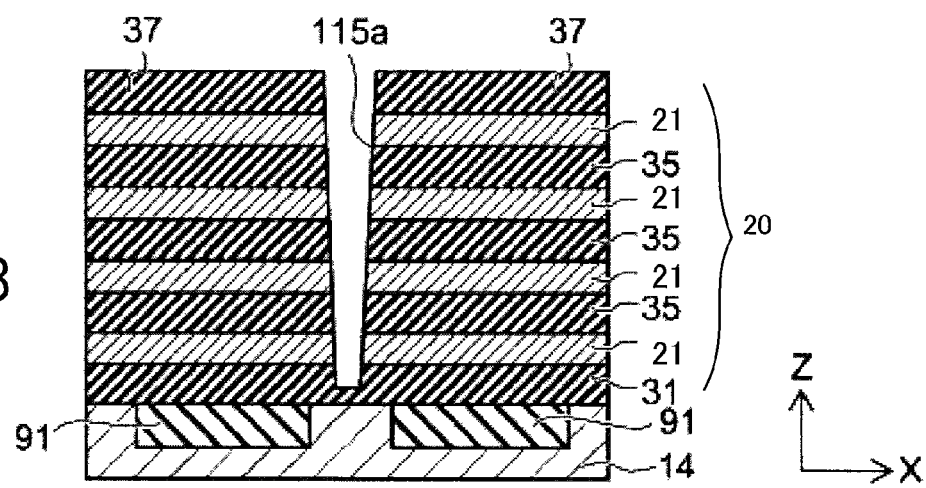
Figure 14C:
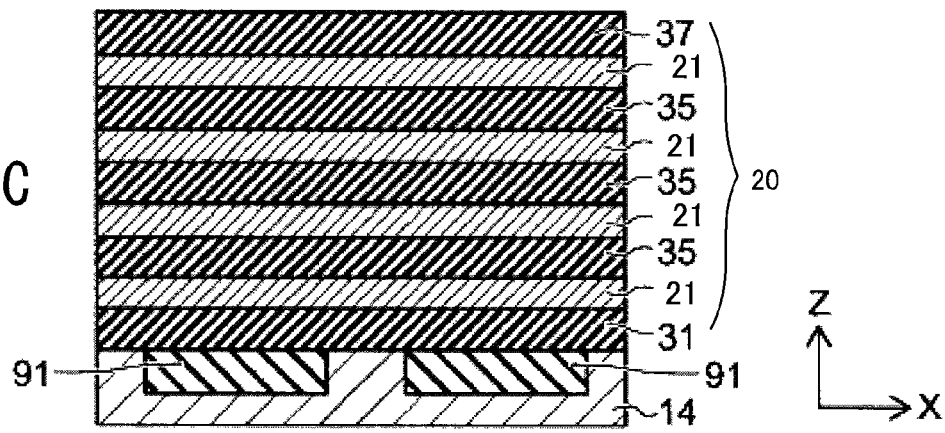

FIG. 14A is a top view illustrating the stack 20. FIG. 14B is a cross-sectional view of the stack 20 taken along the 14B-14B line of FIG. 14A. FIG. 14C is a cross-sectional view of the stack 20 along the 14C-14C line of FIG. 14A.

First of all, the stack 20 is formed on the back gate layer 14. The stack 20 has a structure in which the conductive layers 21 and the insulating layers 35 are alternately stacked in the direction Z. Each conductive layer 21 is composed of polycrystalline silicon, for example. Each insulating layer 35 is composed of a silicon oxide film, for example.

Sacrificial layers 91 are buried in the surface of the back gate layer 14. Each sacrificial layer 91 is composed of a silicon nitride film, for example.

Subsequently, trenches 115a reaching the insulating layer 31 are formed from the top surface of the insulating layer 37. Each trench 115a is provided above a portion between each two sacrificial layers 91 adjacent to each other in the direction X. Furthermore, the plurality of trenches 115a is arranged side by side in the direction Y.

Figure 15A:
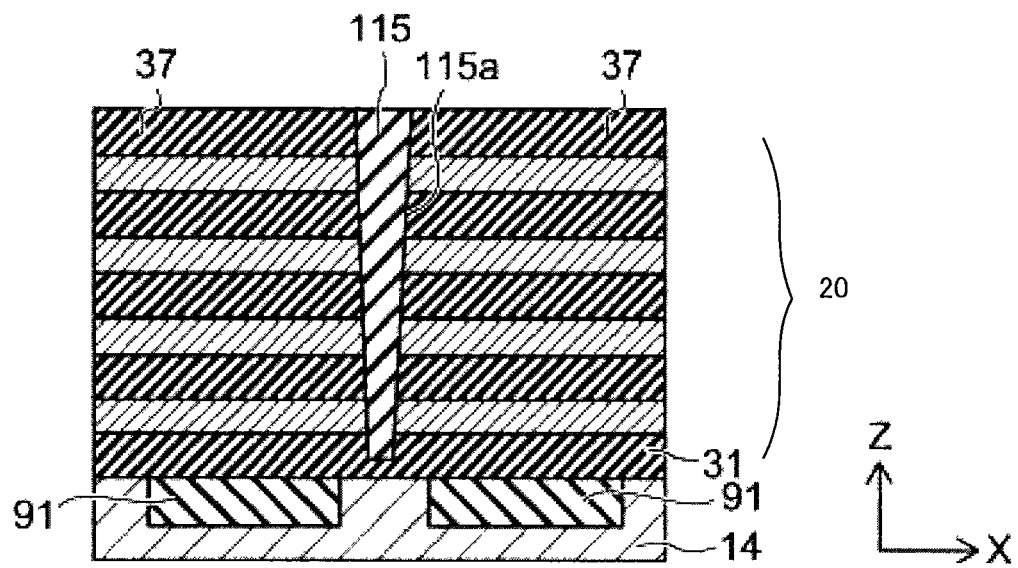
FIGS. 15A and 15B are diagrams illustrating the fabrication process of the nonvolatile semiconductor memory device according to the second embodiment.
Figure 15B:
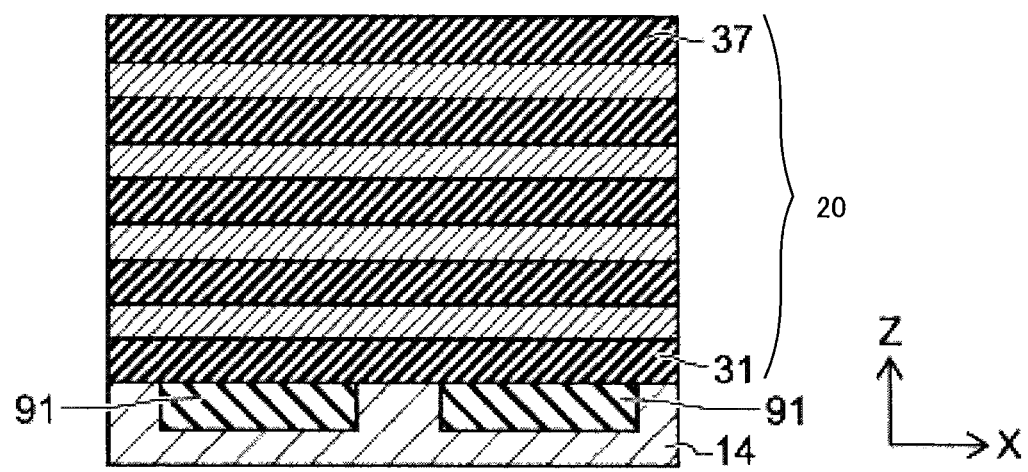

FIG. 15A is a cross-sectional view of the stacks 20 taken along the 14B-14B line of FIG. 14A. FIG. 15B is a cross-sectional view of the stacks 20 taken along the 14C-14C line of FIG. 14A.

As shown in FIG. 15A, the insulating layer 115 is buried into each trench 115a. The insulating layer 115 is composed of a silicon oxide film, for example. In other words, the silicon oxide film is deposited onto the insulating layer 37 in a way that part of the silicon oxide film is buried into the trench 115a. The insulating layer 115 formed on the insulating layer 37 is etched back, and is planarized in a way that the surface of the insulating layer 37 is exposed.

Figure 16A:
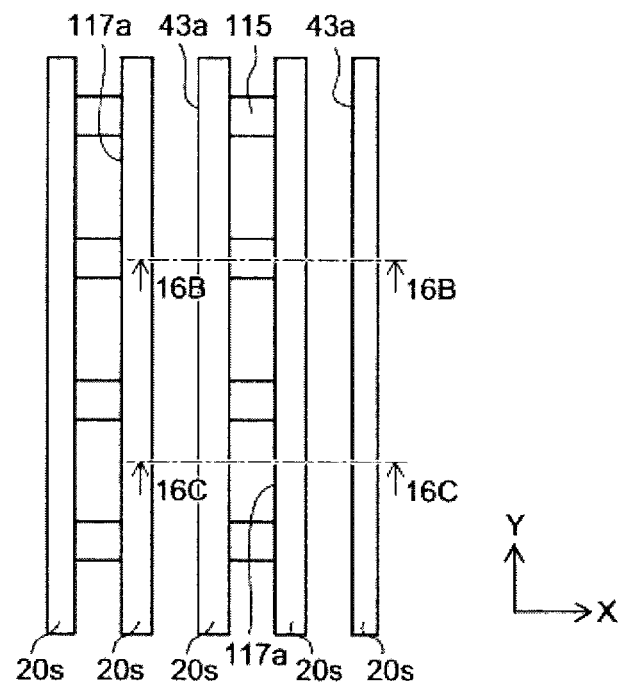
FIGS. 16A to 16C are diagrams illustrating the fabrication process of the nonvolatile semiconductor memory device according to the second embodiment.
Figure 16B:
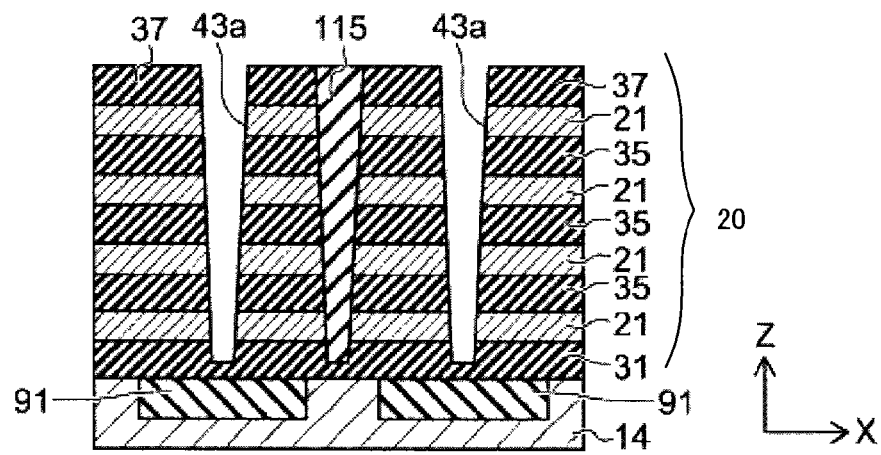
Figure 16C:
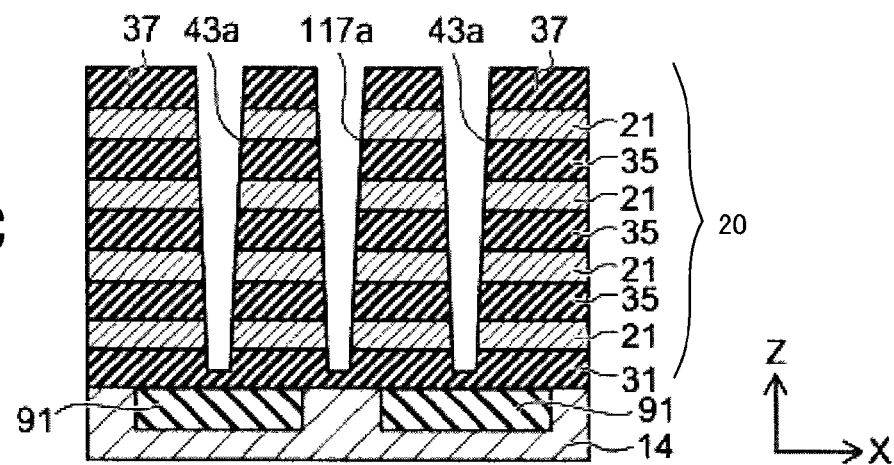

FIG. 16A is a top view illustrating stacks 20s. FIG. 16B is a cross-sectional view of the stacks 20s taken along the 16B-16B line of FIG. 16A. FIG. 16C is a cross-sectional view of the stacks 20s taken along the 16C-16C line of FIG. 16A.

In this step, trenches 43a and trenches 117a are formed in the stack 20 to divide the stack 20 into a plurality of stacks 20. As a result, each conductive layer 21 is divided into a plurality of pieces.

As shown in FIG. 16A, each trench 43a extends in the direction Y, and each trench 117a is provided between the corresponding insulating layers 115 in the direction Y. As a result, the stack 20 is divided into the stacks 20s each in the shape of a stripe.

As shown in FIGS. 16B and 16C, each trench 43a is formed on the corresponding sacrificial trench 91 with the insulating layer 31 interposed in between. Each trench 43a and each trench 117a are formed from the top surface of the insulating layer 37 with a depth reaching the insulating layer 31.

As shown in FIG. 16B, the insulating layer 115 is provided between the two adjacent stacks 20s. As a result, the two stacks 20s are capable of supporting each other with the assistance of the insulating layer 115. In other words, even though the aspect ratio of each stack 20s is large enough to cause the stack 20s to collapse, the substantial aspect ratio can be decreased by making the two adjacent stacks 20s support each other with the assistance of the insulating layer 115. This makes it possible to avoid the collapse of each stack 20s.

Subsequently, the same fabrication steps as those shown in FIGS. 4A to 8B for the first embodiment are carried out, and thereby, the semiconductor layers 30 penetrating the stacks 20s are formed. The sacrificial film buried into each trench 43a and each trench 117a is selectively etched back, and thereby, the ends of the conductive layers 21 are exposed to the inner surface of each of the trenches 43a and 117a.

Figure 17A:
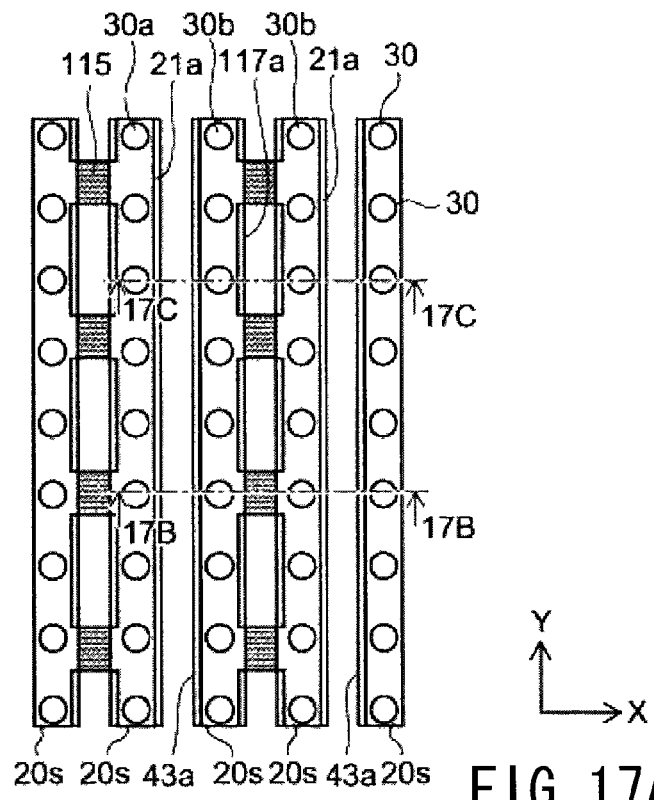
FIGS. 17A to 17C are diagrams illustrating the fabrication process of the nonvolatile semiconductor memory device according to the second embodiment.
Figures 17B, 17C:
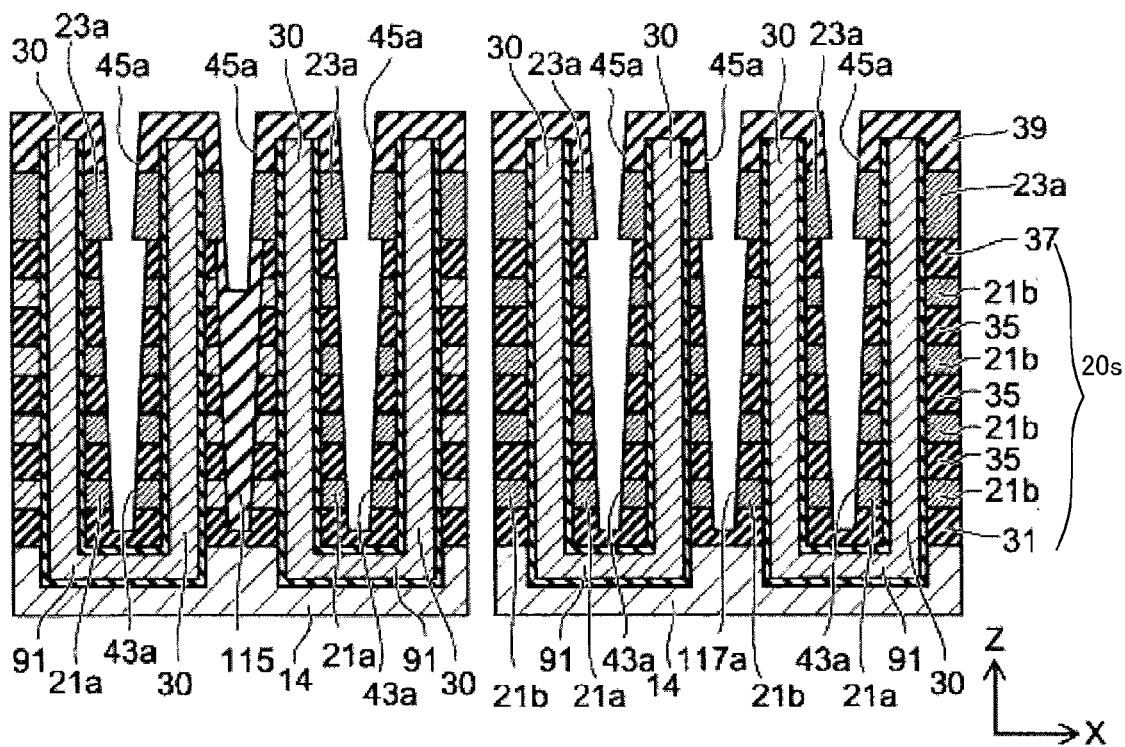

FIG. 17A is a top view of the stacks 20s. FIG. 17B is a cross-sectional view of the stacks 20s taken along the 17B-17B line of FIG. 17A. FIG. 17C is a cross-sectional view of the stacks 20s taken along the 17C-17C line of FIG. 17A.

A nickel (Ni) film, for example, is formed on the inner surface of each of the trenches 43a, the trenches 45a and the trenches 117a, followed by heat treatment. As a result, nickel silicide is formed on the end portions 21b, 21a of the conductive layers 21 in contact with the nickel film, and the end portions 23a of the conductive layers 23 in contact with the nickel film. Subsequently, the nickel films adhered onto the insulating layer 31, the insulating layers 35, the insulating layer 37 and the insulating layer 39 are removed by wet etching, for example.

As shown in FIG. 17A, the end portions 21a extending continuously in the direction Y and including the silicide are formed at the ends of the respective conductive layers 21 exposed to each trench 43a. On the other hand, the end portions 21b extending discontinuously in the direction Y and including the silicide are formed at the ends of the respective conductive layers 21 exposed to each trench 117a.

Subsequently, a silicon oxide film or a silicon nitride film, for example, is buried into the trenches 43a, the trenches 45a and the trenches 117a. As a result, the insulating layers 43 and the insulating layers 117 shown in FIGS. 13A to 13B are formed. The width of the insulating layers 43 in the direction X, the width of the insulating layers 117 in the direction X, and the width of the insulating layers 117 in the direction Y are set at values which do not allow the stacks 20s to collapse with the amount Δw of deformation of the stacks 20s (see FIGS. 11A and 11B) taken into consideration.

Figure 18:
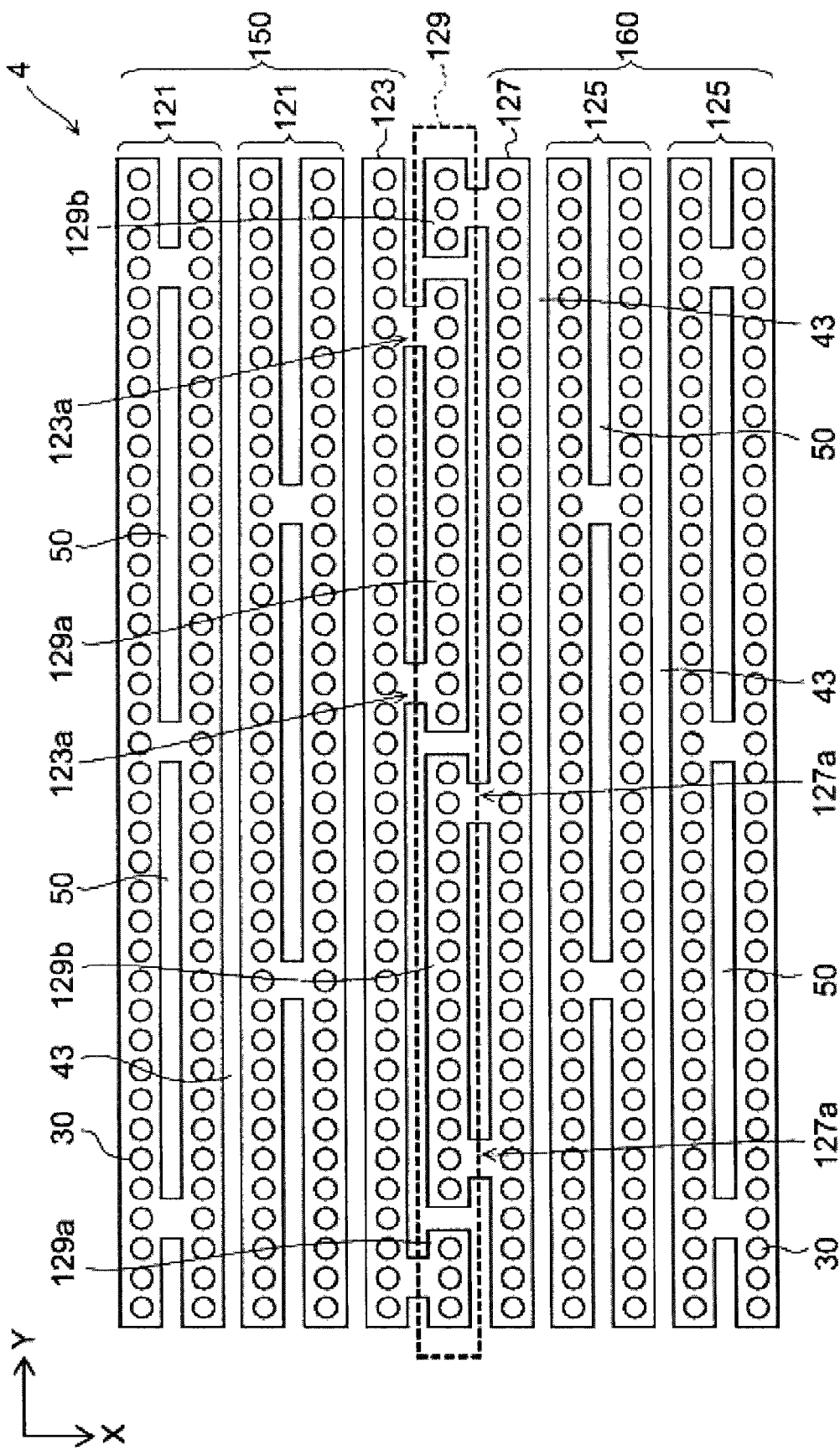
FIG. 18 is a top view illustrating a memory cell array of a nonvolatile semiconductor memory device according to a third embodiment.

A nonvolatile semiconductor memory device according to a third embodiment and a method of fabricating the nonvolatile semiconductor memory device will be described with reference to FIGS. 18 to 19D. FIG. 18 is a top view illustrating a memory cell array 4 according to the third embodiment. The memory cell array 4 includes a first memory cell block 150 and a second memory cell block 160. The first memory cell block 150 and the second memory cell block 160 are arranged side by side in the direction X, for example, on a substrate 10.

The first memory cell block 150 includes a plurality of stacks 121 arranged side by side in the direction X and extending in the direction Y. Each stack 121 includes semiconductor layers 30 and insulating layers 50. The semiconductor layers 30 and the insulating layers 50 are arranged side by side in the direction Y. Each semiconductor layer 30 penetrates the corresponding stack 121 in the direction Z. A memory layer 47 is provided between each stack 121 and each semiconductor layer 30. Each insulating layer 50 penetrates the corresponding stack 121 in the direction Z.

An insulating layer 43 is provided between the adjacent stacks 121. Connection portions 40, albeit not illustrated, are provided under the insulating layer 43. Each connection portion 40 electrically connects one of the plurality of semiconductor layers 30 penetrating one of the adjacent stacks 121 and a corresponding one of the plurality of semiconductor layers 30 penetrating the other of the adjacent stacks 121.

The first memory cell block 150 further includes a stack 123, and support portions 129a connected to the stack 123 via connection portions 123a. The stack 123 is provided along the end of the second memory block 160-side one of the plurality of stacks 121 arranged side by side in the direction X. The stack 123 is provided in a stripe extending in the direction Y, and is arranged side by side with stacks 121.

The second memory cell block 160 includes a plurality of stacks 125 arranged side by side in the direction X and extending in the direction Y. Each stack 125 includes semiconductor layers 30 and insulating layers 50. The semiconductor layers 30 and the insulating layers 50 are arranged side by side in the direction Y. Each semiconductor layer 30 penetrates the corresponding stack 125 in the direction Z. A memory layer 47 is provided between each stack 125 and each semiconductor layer 30. Each insulating layer 50 penetrates the corresponding stack 125 in the direction Z.

An insulating layer 43 is provided between the adjacent stacks 125. Connection portions 40, albeit not illustrated, are provided under the insulating layer 43. Each connection portion 40 electrically connects one of the plurality of semiconductor layers 30 penetrating one of the adjacent stacks 125 and a corresponding one of the plurality of semiconductor layers 30 penetrating the other of the adjacent stacks 125.

The second memory cell block 160 further includes a stack 127, and support portions 129b connected to the stack 127 via connection portions 127a. The stack 127 is provided along the end of the first memory block 150-side one of the plurality of stacks 125 arranged side by side in the direction X. The stack 127 is provided in a stripe extending in the direction Y, and is arranged side by side with stacks 125.

As shown in FIG. 18, the support portions 129a and the support portions 129b are alternately arranged in the direction Y between the first memory cell block 150 and the second memory cell block 160. The support portions 129a and the support portions 129b are formed by dividing a stripe 129 provided between the first memory cell block 150 and the second memory cell block 160, for example.

Figure 20:
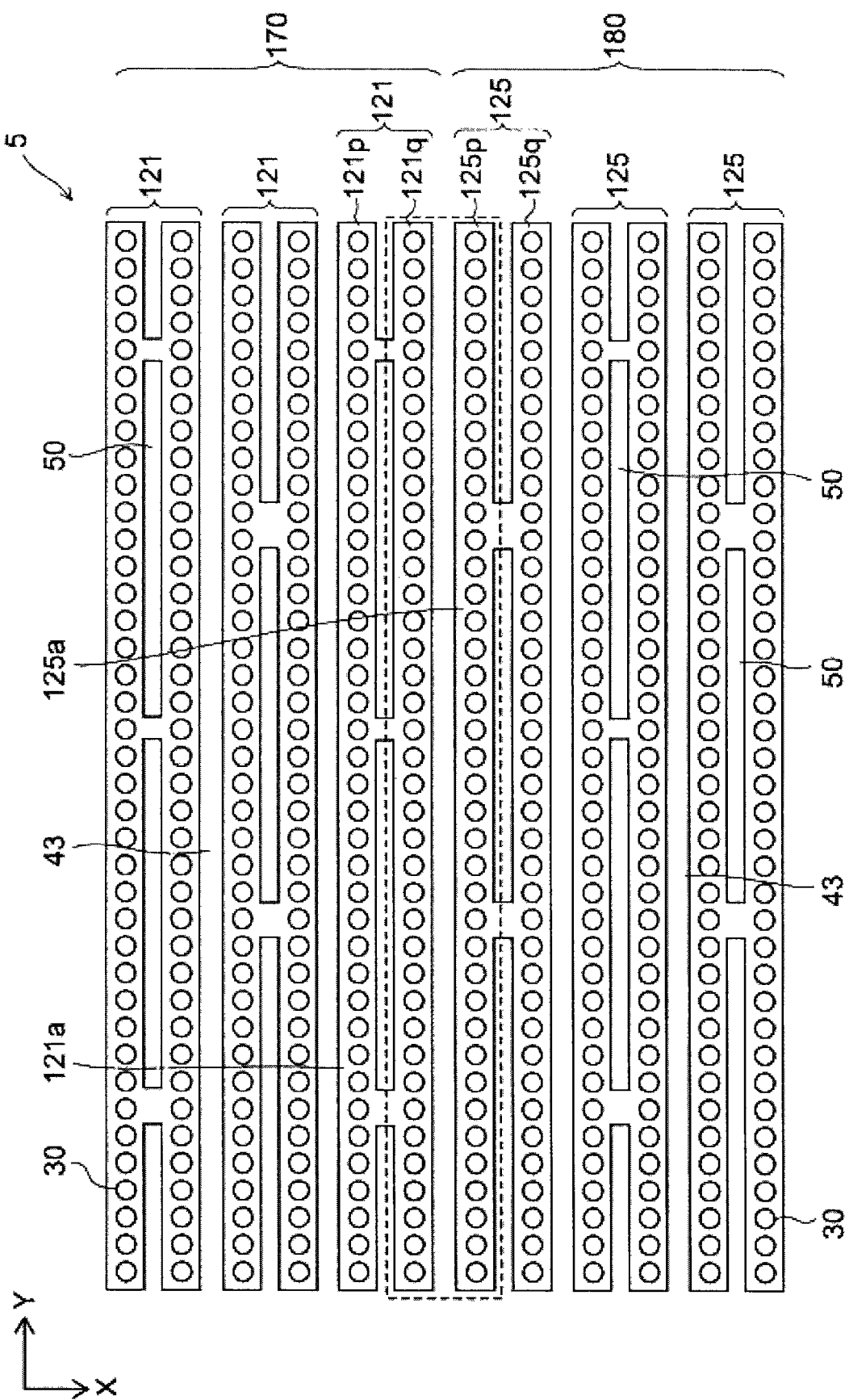
FIG. 20 is a top view illustrating a memory cell array of a nonvolatile semiconductor memory device according to a comparative example.

A memory cell array 5 according to a comparative example, shown in FIG. 20, includes a first memory cell block 170 and a second memory cell block 180.

The first memory cell block 170 includes a plurality of stacks 121 arranged side by side in the direction X. A stack 121a is provided along the second memory cell block 180-side end of the first memory cell block 170. The stack 121a includes a stripe 121p and a stripe 121q. The stripe 121q is provided closer to the second memory cell block 180.

The second memory cell block 180 includes a plurality of stacks 125 arranged side by side in the direction X. A stack 125a is provided along the first memory cell block 170-side end of the second memory cell block 180. The stack 125a includes a stripe 125p and a stripe 125q. The stripe 125q is provided closer to the first memory cell block 170.

The memory cells in the first memory cell block 170 are not electrically connected to the memory cells in the second memory cell block 180. For this reason, the semiconductor layers 30 provided in the stripe 121q are not connected to the semiconductor layers 30 provided in the stripe 125p via the connection portions 40. In other words, none of the memory cells provided in the stripe 121q, or none of the memory cells provided in the stripe 125p contribute to the memory capacity of the memory cell array 5.

In contrast, in the embodiment, the semiconductor layers 30 provided in the stack 123 and the semiconductor layers 30 provided in the adjacent stack 121 are connected together, forming the memory strings 90. This is the case with the stack 127 provided along the end of the second memory cell block 160.

No memory cells provided in the support portions 129a connected to the stack 123, or no memory cells provided in the support portions 129b connected to the stack 127 contribute to the memory capacity of the memory cell array 4. However, the occupation areas of the support portions 129a and 129b are small.

The embodiment can reduce the number of stripes which do not contribute to the memory capacity. In addition, the embodiment can effectively employ the area of the memory cell array on the substrate 10, and accordingly can achieve the increase in the capacity of the memory cell array. Furthermore, the stack 123 avoids the collapse by being supported by the support portions 129a. Moreover, the stack 127 avoids the collapse by being supported by the support portions 129b.

The width of the stack 123 provided along the end of the first memory cell block 150 can be set narrower than the width of the other stacks 121. The width of the stack 127 provided along the end of the second memory cell block 160 can be set narrower than the width of the other stacks 125. Furthermore, the width of the support portions 129a, 129b can be set narrower than the width of the stacks 121, 125. Consequently, it is possible to effectively employ the space in the boundary between the memory cell blocks, and accordingly to increase the memory capacity of the memory cell array.

Moreover, the stacks 121, 125 can keep the width $W_E$ wider, and accordingly can be prevented from collapsing. Besides, since the end portions of the respective conductive layers 21 in contact with the insulating layers are silicidized, the electric resistance can be reduced.

As described above, the embodiment is capable of achieving a higher yield and reducing the chip area without worsening the time constant of the word lines (conductive layers 21). In other words, the embodiment is capable of reconciling an enhancement in the performance and a reduction in costs for the nonvolatile semiconductor memory device.

FIGS. 19A to 19D are top views illustrating a method of fabricating the memory cell array 5 according to the third embodiment.

In the embodiment, a stack which includes the conductive layers 21 stacked with the insulating layers interposed between the conductive layers 21 and the insulating layers 35 provided between the conductor layers 21, for example, is formed. Thereafter, the trenches 43a to divide the stack are formed (see FIGS. 3A to 3C). Thereby, the first memory cell block 150 and the second memory cell block 160 are formed.

The first memory cell block 150 includes the plurality of stacks 121 arranged side by side in the direction X and extending in the direction Y, and the support portions 129a connected to the stack 123 situated along the end of the plurality of stacks 121.

The second memory cell block 160 includes the plurality of stacks 125 arranged side by side in the direction X and extending in the direction Y, and the support portions 129b connected to the stack 127 situated along the end of the plurality of stacks 125.

It is desirable that no memory holes 103 (see FIGS. 5A and 5B) be formed between the support portions 129a and the support portions 129b.

Figure 19A:
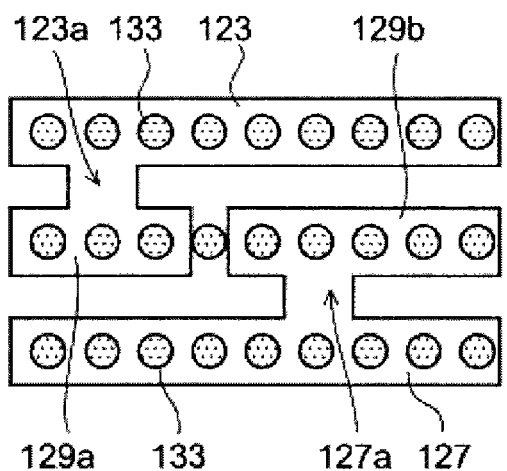
FIGS. 19A to 19D are top views illustrating memory cell arrays of the nonvolatile semiconductor memory device according to the third embodiment.
Figure 19B:
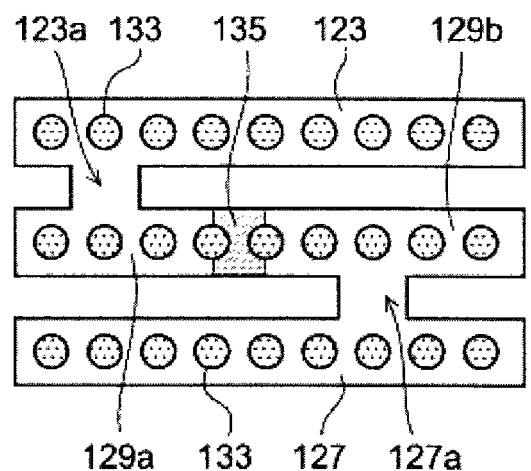

As shown in FIG. 19A, a pattern 133 for the memory hole 103, for example, may be arranged in each portion to separate the support portion 129a and the support portion 129b. Otherwise, as shown in FIG. 19B, an insulating film 135 may be buried in each portion to separate the support portion 129a and the support portion 129b (see FIG. 14A to FIG. 15B).

Figure 19C:
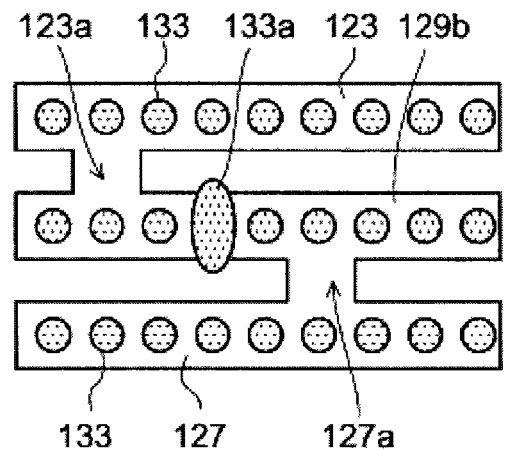
Figure 19D:
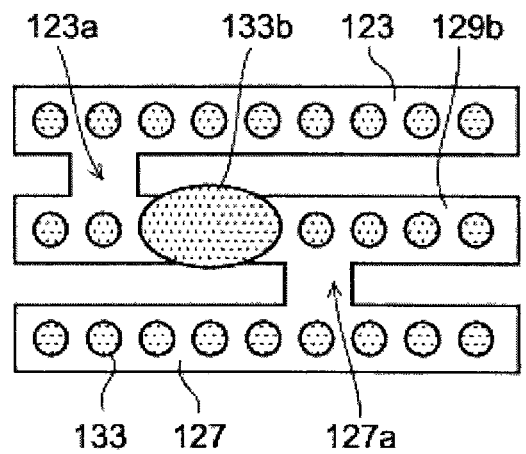

Otherwise, as shown in FIGS. 19C and 19D, the stripe 129 connected to the stack 123 and the stack 127 is formed when the stacks 121 are separated from the stacks 125. In other words, the support portions 129a and the support portions 129b are formed in a state of being connected one to another. Thereafter, the support portions 129a and the support portion 129b may be formed by dividing the stripe 129 when the memory holes 103 are formed.

In this case, the pattern 133 to divide the stripe 129 is arbitrary. As shown in FIG. 19A, the pattern 133 may be a pattern 133a having the same width as the memory holes 103, for example. Otherwise, as shown in FIG. 19B, the pattern 133 may be a wide pattern 133b including a plurality of memory holes 103.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:
a first stack unit extending in a first direction, the first direction being in a plane parallel with a substrate, and including first conductive layers stacked above the substrate with first insulating layers interposed between the first conductive layers;
a first semiconductor pillar and a second semiconductor pillar arranged in a second direction crossing the first direction, the second direction being in the plane parallel with the substrate, each of the first semiconductor pillar and the second semiconductor pillar penetrating the first stack unit in a stacking direction and including a first memory layer and a first semiconductor layer, the first memory layer being provided between the first semiconductor layer and one of the first conductive layers; and
second insulating layers provided in first trenches, the first trenches penetrating the first stack unit in the stacking direction, the first trenches being arranged between the first semiconductor pillar and the second semiconductor pillar, the first trenches being arranged at a predetermined interval in the first direction.

2. The device according to claim 1, wherein
each of the first conductive layers in contact with at least one of the first insulating layers includes a silicide.

3. The device according to claim 1, wherein
the first trenches are provided in a linear arrangement.

4. The device according to claim 1, further comprising:
a first select gate layer and a second select gate layer provided above the first stack unit; and
a third insulating layer provided in a second trench, the second trench being provided between the first select gate layer and the second select gate layer, the first select gate layer and the second select gate layer being insulated by the second trench.

5. The device according to claim 1, further comprising:
a second stack unit extending in the first direction and including second conductive layers stacked above the substrate with fourth insulating layers interposed between the second conductive layers;
a third semiconductor pillar penetrating the second stack unit in the stacking direction and including a second memory layer and a second semiconductor layer, the second memory layer being provided between the second semiconductor layer and one of the second conductive layers; and
a fifth insulating layer provided in a third trench, the third trench being provided between the first stack unit and the second stack unit and extending in the first direction, the first conductive layers and the second conductive layers being insulated by the third trench.

6. The device according to claim 5, wherein
each of the second conductive layers in contact with the fifth insulating layer includes a silicide.

7. The device according to claim 5, further comprising:
a third select gate layer provided above the second stack unit; and
a sixth insulating layer provided in a fourth trench, the fourth trench being provided between the second select gate and the third select gate, the sixth insulating layer being in contact with the fifth insulating layer, the second select gate layer and the third select gate layer being insulated by the sixth insulating layer.

8. The device according to claim 5, further comprising:
a connection semiconductor layer connected to a lower portion of the second semiconductor layer and a lower portion of the third semiconductor layer; and
a back gate layer provided on the connection semiconductor layer via a seventh insulating layer.

9. The device according to claim 8, wherein
a first memory string is composed of the second semiconductor pillar, the third semiconductor pillar, and the first connection portion.

10. The device according to claim 5, further comprising:
a fourth semiconductor pillar penetrating the second stack unit in the stacking direction and including a third memory portion and a third semiconductor layer, the third memory being provided between the third semiconductor layer and one of the second conductive layer, the third semiconductor pillar and the fourth semiconductor pillar being arranged in the second direction; and
eighth insulating layers provided in fifth trenches, the fifth trenches penetrating the second stack unit in the stacking direction, the fifth trenches being arranged between the third semiconductor pillar and the fourth semiconductor pillar, the fifth trenches being arranged at predetermined interval in the first direction.

11. The device according to claim 10, wherein
locations of the second insulating layers are shifted from locations of the eighth insulating layers in the first direction.

12. The device according to claim 5, further comprising:
a wiring electrically connected to an upper portion of the second semiconductor layer and an upper portion of the third semiconductor layer.

13. The device according to claim 1, wherein
the first stack unit has a stripe shape extending in the first direction.

14. The device according to claim 5, wherein
the third trench has a stripe shape extending in the first direction.

* * * * *